(12) United States Patent
Atanackovic

(10) Patent No.: US 11,282,704 B2
(45) Date of Patent: Mar. 22, 2022

(54) METHODS AND MATERIAL DEPOSITION SYSTEMS FOR FORMING SEMICONDUCTOR LAYERS

(71) Applicant: Silanna UV Technologies Pte Ltd, Singapore (SG)

(72) Inventor: Petar Atanackovic, Henley Beach South (AU)

(73) Assignee: Silanna UV Technologies Pte Ltd, Singapore (SG)

( * ) Notice: Subject to any disclaimer, the term of this patent is extended or adjusted under 35 U.S.C. 154(b) by 0 days.

(21) Appl. No.: 16/949,861

(22) Filed: Nov. 17, 2020

(65) Prior Publication Data

US 2021/0074542 A1    Mar. 11, 2021

Related U.S. Application Data

(63) Continuation of application No. PCT/IB2019/054463, filed on May 29, 2019.
(Continued)

(51) Int. Cl.
*H01L 21/02* (2006.01)
*H01L 21/66* (2006.01)

(52) U.S. Cl.
CPC .... *H01L 21/02631* (2013.01); *H01L 21/0262* (2013.01); *H01L 21/02263* (2013.01); *H01L 21/02554* (2013.01); *H01L 22/12* (2013.01)

(58) Field of Classification Search
None
See application file for complete search history.

(56) References Cited

U.S. PATENT DOCUMENTS 4,806,502 A  *  2/1989  Jorke ..................... C30B 29/06
                                                                  117/106
7,744,965 B2      6/2010  Matsumoto et al.
(Continued)

FOREIGN PATENT DOCUMENTS

EP       1081256 A2      3/2001
JP    2009260003 A     11/2009
(Continued)

OTHER PUBLICATIONS

International Search Report dated Sep. 19, 2019 for PCT Patent Application No. PCT/IB2019/054463.
(Continued)

*Primary Examiner* — Bo B Jang
(74) *Attorney, Agent, or Firm* — MLO, a professional corp.

(57) ABSTRACT

Systems and methods for forming semiconductor layers, including oxide-based layers, are disclosed in which a material deposition system has a rotation mechanism that rotates a substrate around a center axis of a substrate deposition plane of the substrate. A material source that supplies a material to the substrate has i) an exit aperture with an exit aperture plane and ii) a predetermined material ejection spatial distribution from the exit aperture plane. The exit aperture is positioned at an orthogonal distance, a lateral distance, and a tilt angle relative to the center axis of the substrate. The system can be configured for either i) minimum values for the orthogonal distance and the lateral distance to achieve a desired layer deposition uniformity using a set tilt angle, or ii) the tilt angle to achieve the desired layer deposition uniformity using a set orthogonal distance and a set lateral distance.

19 Claims, 12 Drawing Sheets

Related U.S. Application Data

(60) Provisional application No. 62/682,005, filed on Jun. 7, 2018.

(56) References Cited

U.S. PATENT DOCUMENTS

| | | |
|---|---|---|
| 7,824,955 B2 | 11/2010 | White et al. |
| 7,858,436 B2 | 12/2010 | Kato et al. |
| 8,137,458 B2 | 3/2012 | Kato et al. |
| 2002/0025594 A1 | 2/2002 | Iwata et al. |
| 2003/0091865 A1 | 5/2003 | Chen et al. |
| 2005/0045091 A1 | 3/2005 | Kawasaki |
| 2010/0090214 A1* | 4/2010 | Nakahara .......... H01L 21/02576 257/43 |
| 2011/0062440 A1 | 3/2011 | Adekore et al. |
| 2013/0146916 A1 | 6/2013 | Yamamoto et al. |
| 2014/0084288 A1 | 3/2014 | Saito et al. |

FOREIGN PATENT DOCUMENTS

| | | |
|---|---|---|
| JP | 4431925 B2 | 3/2010 |
| KR | 1020170095463 A | 8/2017 |

OTHER PUBLICATIONS

Ex Parte Quayle Action dated Jan. 25, 2021 for U.S. Appl. No. 16/949,860.

Notice of Allowance dated Feb. 18, 2021 for U.S. Appl. No. 16/949,860.

\* cited by examiner (VFP tilt angle α=45°, cosine N factor=2, $R_{SUB}$=1.5)

(VFP tilt angle α=45°, cosine N factor=3, $R_{SUB}$=1.5)

(VFP tilt angle α=30°, cosine N factor=3, $R_{SUB}$=1.5)

METHODS AND MATERIAL DEPOSITION SYSTEMS FOR FORMING SEMICONDUCTOR LAYERS

RELATED APPLICATIONS

This application is a continuation of International Patent Application No. PCT/IB2019/054463, filed on May 29, 2019 and entitled "Methods and Material Deposition Systems for Forming Semiconductor Layers"; which claims priority to U.S. Provisional Patent Application No. 62/682,005, filed on Jun. 7, 2018 and entitled "Material Deposition System and Methods"; all of which are hereby incorporated by reference for all purposes.

BACKGROUND

In semiconductor fabrication processes, thin film materials are deposited on a planar deposition surface using, for example, a source material in a reaction chamber. Molecular beam epitaxy (MBE) is one of several methods of depositing single crystal thin films in a reaction chamber. Molecular beam epitaxy takes place in high vacuum (HV) or ultra-high vacuum (UHV) (e.g., $10^{-6}$ to $10^{-9}$ Pa). The most important aspects of MBE are (1) the flexibility in the selection of source material species; (2) the abruptness of interfaces between dissimilar films deposited; (3) the low impurity levels of the films deposited; and (4) the precise and uniform thickness of the films deposited. The last aspect is achieved by using deposition rates that are relatively slower (typically less than 1,000 nm per hour) than those of other conventional deposition processes like chemical vapor deposition (CVD) which typically exceed 10,000 nm per hour. The slow deposition rates (or growth rates) of MBE are used advantageously to grow the thin films epitaxially; however, MBE requires proportionally higher reactor vacuum to match the low impurity levels achieved by other deposition techniques (e.g. CVD).

In a deposition process like MBE, a high-quality film may have a thickness uniformity of about 99% or greater across the deposition plane. Stated another way, a high-quality film may have a thickness non-uniformity of about 1% or less across the deposition plane. Uniformity across the deposition plane is critical in current MBE processes, as there is a direct correlation between the growth rate and the quality of a film that is epitaxially grown. That is, the slower deposition rate enables uniform atomic monolayer-scale coverages to be controlled across the entire deposition plane to achieve a two-dimensional (2D) "layer-by-layer" (LbL) growth mode. Thin film deposition using the LbL growth mode enables a complete 2D layer to form prior to growth of subsequent layers, which is the most desirable method for the epitaxial growth of single crystal thin films and multi-layered heterogeneous films. Typically, the LbL growth mode is achieved for the technologically relevant semiconductors (e.g., AlGaAs, AlGaN, SiGe, and the like) under at least the following criteria of: (i) highly non-equilibrium temperature-pressure conditions; (ii) a uniform arrival rate of species across the deposition plane; and (iii) a highly uniform spatial temperature that can be imparted to the growing surface.

SUMMARY

In some embodiments, an optoelectronic device includes a substrate and a multi-region stack epitaxially deposited upon the substrate. The multi-region stack comprises a crystal polarity having an oxygen-polar crystal structure or a metal-polar crystal structure along a growth direction. The multi-region stack includes a first region comprising a buffer layer, a second region comprising a crystal structure improvement layer, a third region comprising a first conductivity type, a fourth region comprising an intrinsic conductivity type layer, and a fifth region comprising a second conductivity type, where the second conductivity type is opposite the first conductivity type. At least one region of the multi-region stack is a bulk semiconductor material comprising $Mg_{(x)}Zn_{(1-x)}O$. At least one region of the multi-region stack is a superlattice comprising at least two of: ZnO, MgO and $Mg_{(x)}Zn_{(1-x)}O$.

In some embodiments, an optoelectronic device includes a substrate and a multi-region stack epitaxially deposited upon the substrate. The multi-region stack comprises a non-polar crystalline material structure along a growth direction. The multi-region stack includes a first region comprising a buffer layer, a second region comprising a crystal structure improvement layer, a third region comprising a first conductivity type, a fourth region comprising an intrinsic conductivity type layer, and a fifth region comprising a second conductivity type, where the second conductivity type is opposite the first conductivity type. At least one region of the multi-region stack is a bulk semiconductor material comprising $Mg_{(x)}Zn_{(1-x)}O$. At least one region of the multi-region stack is a superlattice comprising at least two of: ZnO, MgO and $Mg_{(x)}Zn_{(1-x)}O$.

In some embodiments, a method of configuring a material deposition system includes providing a rotation mechanism that rotates a substrate around a center axis of a substrate deposition plane of the substrate. A material source that supplies a material to the substrate is selected, where the material source has i) an exit aperture with an exit aperture plane and ii) a predetermined material ejection spatial distribution from the exit aperture plane. The predetermined material ejection spatial distribution has a symmetry axis which intersects the substrate at a point offset from the center axis. The exit aperture is positioned at an orthogonal distance, a lateral distance, and a tilt angle relative to the center axis of the substrate. The method also includes setting either i) the tilt angle or ii) the orthogonal distance and the lateral distance for the exit aperture of the material source. A desired accumulation of the material on the substrate is selected to achieve a desired layer deposition uniformity for a desired growth rate. The method determines either i) minimum values for the orthogonal distance and the lateral distance to achieve the desired layer deposition uniformity using the set tilt angle or ii) the tilt angle to achieve the desired layer deposition uniformity using the set orthogonal distance and the set lateral distance. The substrate and the material source are contained within a vacuum environment.

In some embodiments, a method for forming semiconductor layers includes rotating a substrate around a center axis of a substrate deposition plane of the substrate, heating the substrate, and providing a material source that supplies a material to the substrate. The material source has i) an exit aperture with an exit aperture plane and ii) a predetermined material ejection spatial distribution from the exit aperture plane, the predetermined material ejection spatial distribution having a symmetry axis which intersects the substrate at a point offset from the center axis. The exit aperture is positioned at an orthogonal distance, a lateral distance, and a tilt angle relative to the center axis of the substrate. The method also includes containing the substrate and the material source within a vacuum environment and emitting the material from the material source to form a semiconductor layer on the substrate. The exit aperture is positioned such that either i) the orthogonal distance and the lateral distance are minimized for a set tilt angle, to achieve a desired layer deposition uniformity for a desired layer growth rate of the semiconductor layer on the substrate, or ii) the tilt angle is determined for a set orthogonal distance and a set lateral distance, to achieve the desired layer deposition uniformity for the desired layer growth rate of the semiconductor layer on the substrate.

In some embodiments, a material deposition system has a rotation mechanism that rotates a substrate deposition plane of a substrate around a center axis of the substrate deposition plane, a heater configured to heat the substrate, a material source that supplies a material to the substrate, and a positioning mechanism. The material source has i) an exit aperture with an exit aperture plane and ii) a predetermined material ejection spatial distribution from the exit aperture plane. The predetermined material ejection spatial distribution has a symmetry axis which intersects the substrate at a point offset from the center axis, where the exit aperture is positioned at an orthogonal distance, a lateral distance, and a tilt angle relative to the center axis of the substrate. The positioning mechanism allows dynamic adjusting of the orthogonal distance, the lateral distance, or the tilt angle.

In some embodiments, a method for forming oxide-based semiconductor layers includes rotating a substrate around a center axis of a substrate deposition plane of the substrate, heating the substrate, and placing a plurality of material sources facing the substrate. The plurality of material sources includes a magnesium (Mg) source and a plasma source of nitrogen or oxygen. Each of the plurality of material sources has i) an exit aperture with an exit aperture plane and ii) a predetermined material ejection spatial distribution from the exit aperture plane, the material ejection spatial distribution having a symmetry axis which intersects the substrate at a point offset from the center axis. The exit aperture is positioned at an orthogonal distance, a lateral distance, and a tilt angle relative to the center axis of the substrate. The method also includes emitting materials from the plurality of material sources onto the substrate to form an oxide-based layer on the substrate. The exit aperture is positioned such that either i) the orthogonal distance and the lateral distance are minimized for a set tilt angle, to achieve a desired layer deposition uniformity for a desired layer growth rate of the oxide-based layer on the substrate, or ii) the tilt angle is determined for a set orthogonal distance and a set lateral distance, to achieve a desired layer deposition uniformity for the desired layer growth rate of the oxide-based layer on the substrate.

In some embodiments, a method for forming semiconductor layers includes rotating a substrate deposition plane of a substrate around a center axis of the substrate deposition plane, heating the substrate, and placing a plurality of material sources facing the substrate. The plurality of material sources includes a magnesium (Mg) source, a zinc (Zn) source, and a plasma source of nitrogen or oxygen, where each of the plurality of material sources has i) an exit aperture with an exit aperture plane and ii) a predetermined material ejection spatial distribution from the exit aperture plane. The material ejection spatial distribution has a symmetry axis which intersects the substrate at a point offset from the center axis. The exit aperture is positioned at an orthogonal distance, a lateral distance, and a tilt angle relative to the center axis of the substrate. Materials from the plurality of material sources are emitted onto the substrate to form a p-type doped layer on the substrate. The exit aperture is positioned such that either i) the orthogonal distance and the lateral distance are minimized for a set tilt angle, to achieve a desired layer deposition uniformity for a desired layer growth rate of the p-type doped layer on the substrate, or ii) the tilt angle is determined for a set orthogonal distance and a set lateral distance, to achieve a desired layer deposition uniformity for the desired layer growth rate of the p-type doped layer on the substrate.

DETAILED DESCRIPTION

Figure 1:
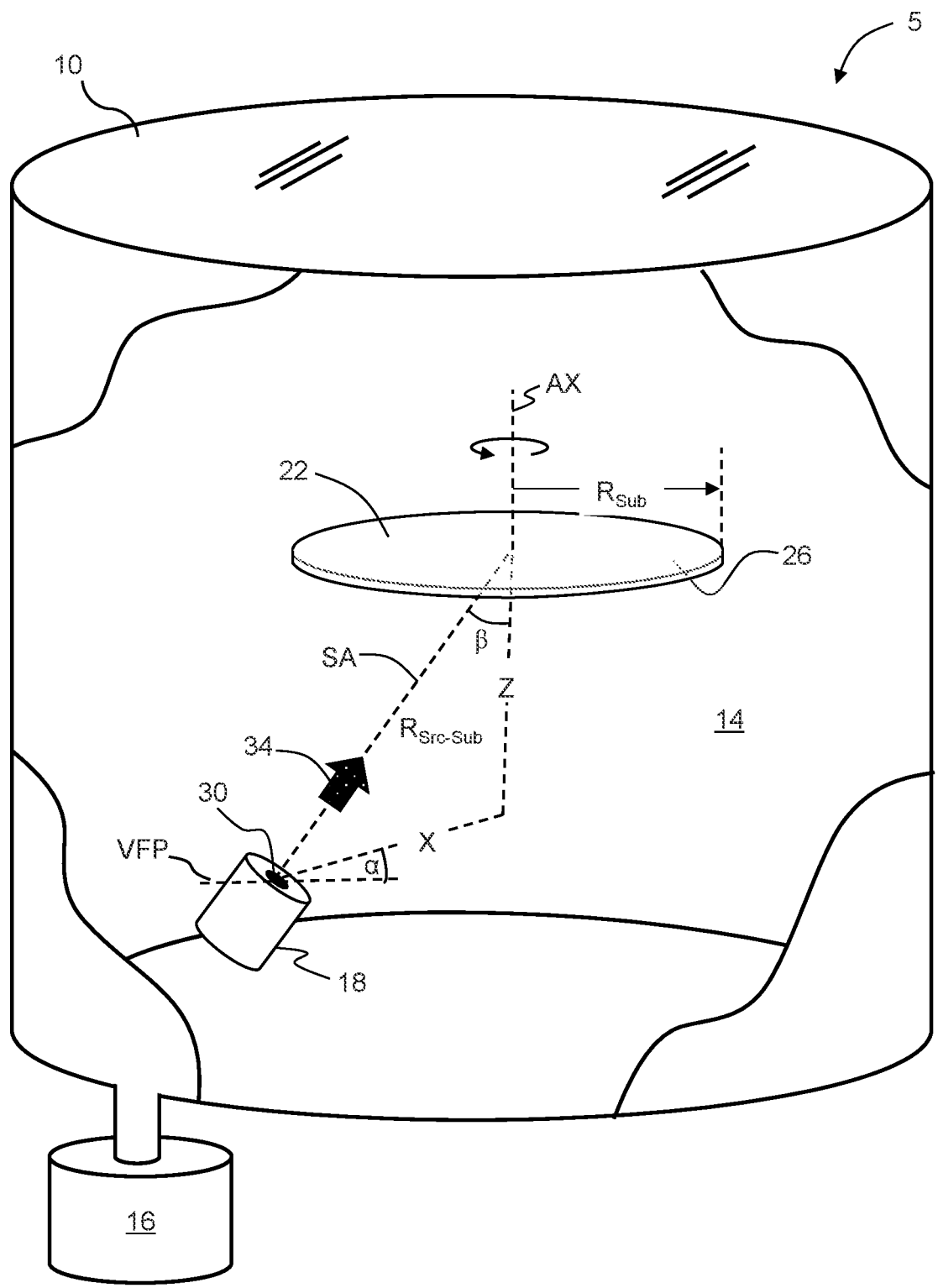
FIG. 1 is an isometric view of a conventional high-vacuum reaction chamber.

This disclosure relates generally to semiconductor fabrication processes, and more particularly to material deposition systems having an off-axis material source in a high-vacuum reaction chamber for improving the balance between film quality and film growth rate. Methods for configuring the material deposition systems are disclosed, by determining a position of a material source and also scaling the size of the overall reaction chamber according to the placement of the material source. This disclosure also relates to high-quality, oxide-based semiconductor structures such as light-emitting diodes (LEDs), and the systems and methods for forming such structures.

High film quality that can be achieved using UHV deposition techniques is conventionally achieved by incurring a substantial increase in process time compared with other mature high-pressure CVD semiconductor fabrication processes. Unfortunately, best practice conventional UHV deposition methods, such as MBE, cannot adequately accommodate the high throughput processing demanded by silicon-based semiconductor manufacturers. Additionally, current MBE processes are limited to growing high-uniformity films on relatively small area deposition surfaces, such as on 6-inch diameter and smaller substrates. The silicon-based semiconductor industry emphasizes the importance of scaling fabrication processes to larger deposition surfaces, such as 8-, 12-, and even 18-inch deposition surfaces to maintain a sufficiently low deposition cost per unit area ($/m²). Therefore, new approaches are needed for MBE processes to scale to larger deposition surfaces as well as to provide high film quality at high deposition rates.

In semiconductor device manufacturing, group III-nitride (III-N) semiconductors (e.g., aluminum nitride, gallium nitride, aluminum-gallium nitride, indium nitride) are generally recognized as belonging to one of the most promising semiconductor families for fabricating the wide bandgap semiconductors that are used in the fabrication of deep-ultraviolet (DUV) optical devices, such as LEDs and laser diodes (LDs). Unfortunately, several challenges inherent to conventional manufacturing equipment and methods limit the fabrication of high-quality group III-N films.

For example, controlling the growth temperatures and precursor gas levels necessary for high-quality film deposition is difficult with substrates larger than 4 inches in diameter, as mentioned above. A non-uniform temperature profile across the film formation surface may yield low-quality or unusable devices. Further, conventional group III-N film formation is a relatively inefficient, low-throughput, and expensive process with low utilization of costly source materials. Finally, conventional group III-N films are limited in their device-bandgap tuning ability. This reduces flexibility in semiconductor device design and application, particularly in the manufacture of DUV LEDs. As the semiconductor industry increasingly emphasizes the production of high-quality films on larger substrates, higher production throughput, and reduced manufacturing costs, new approaches for device manufacturing are needed.

In the present disclosure, methods of configuring an offset material source in a high-vacuum reaction chamber with respect to improving the balance between film quality and film growth rate are provided. For example, embodiments are used to determine the position of a material source (e.g., a Knudsen effusion cell, a gas injector source, a remote plasma source, an ion beam source, a sputtering source, a charged particle beam, a thermal evaporation source, or an ablation source) with respect to a film formation surface in a high-vacuum reaction chamber that provides an improved balance between film quality and film growth rate compared with the conventional art. More specifically, for a given material source that has certain attributes or characteristics, and a given tilt angle setting for the material source, the methods are used to determine a lateral distance and an orthogonal distance of the material source with respect to a formation surface for improving the balance between film quality and film growth rate. In other embodiments, the lateral distance and orthogonal distance of the material source can be set, and a tilt angle can be determined to achieve a desired film quality and film growth rate.

Systems for and methods of forming a high-quality, oxide-based DUV LED are also disclosed. Oxide-based semiconductors are wide bandgap semiconductors classified in the II-VI semiconductor group. In general, they offer good transparency, high electron mobility, wide bandgaps, and strong luminescence at room temperature. Oxide-based semiconductors are intrinsically n-type; conventionally, p-type doping of oxides is difficult to accomplish. P-type doping of these semiconductors in the present embodiments is achieved using a plasma of active atomic nitrogen (N*) or molecular nitrogen ($N_2$*). The methods disclosed herein utilize a plasma reaction chamber and form films on substrates made of materials such as calcium fluoride. In some embodiments, a buffer layer of magnesium zinc oxide (MgZnO) is formed on the substrate, and an MgO—MgZnO multilayer is formed atop the buffer layer. An n-type MgZnO is then formed atop the MgO—MgZnO multilayer, and a not-intentionally doped (NID) layer of MgZnO or MgO is formed atop the n-type MgZnO layer. A p-type MgZnO layer is then formed using p-type doping from a plasma of N* or $N_2$*. Finally, metal contacts are formed on the device structure using a conventional lithography and metallization process. In one example of operation, the n-type MgZnO layer produces electrons that move into the NID layer, where charge carriers interact and recombine to emit light from the LED device structure in the UV wavelength range of from about 100 nm to about 280 nm.

The methods and the materials used to form the high-quality, oxide-based DUV LEDs exhibit advantages over conventional methods and materials. For example, controlling the growth temperatures and precursor gas levels necessary for high-quality film deposition of group III-N film with conventional methods is difficult, especially with substrates larger than 4 inches in diameter. Further, conventional group III-N film formation is a relatively inefficient, low-throughput, and expensive process with low utilization of costly source materials. Finally, conventional group III-N films have limited bandgap-tuning ability. This limits flexibility in semiconductor device design and application, particularly in the production of DUV LEDs. By contrast, the methods disclosed herein emphasize the production of high-quality films on larger substrates, greater device application flexibility, higher production throughput, and reduced manufacturing costs.

MBE is but one example of a process in which a plurality of thin crystalline films is epitaxially grown in a high-vacuum environment. Such films are composed of, for example, compound semiconductors chosen from the periodic table of elements. For example, IIIA-VA semiconductors may include group-IIIA metals chosen from at least one of Al, Ga, and In, and group-VA species chosen from As, P, and N to create stoichiometric compositions of $Al_xGa_{1-x}As_yP_{1-y}$ and $Al_xGa_{1-x}N$. In another example, II-VI semiconductors may include group-II metals chosen from Cd and Zn, and group-VI species chosen from Te, S, and Se to form compound $Zn_xCd_{1-x}Te$. Further examples include IV-IV (e.g., $Si_xGe_yC_z$) and metal oxides $MO_x$. Other examples of metal oxides are RE-Oxides and RE-OxyNitrides (wherein RE is chosen from at least one species from the group of rare-earth elements, namely, the lanthanide series metal species or alkaline-earth metal species) or mixed-oxides of the form IIA-IB-VIA (e.g., $Mg_xZn_{1-x}O$), which are also example materials fabricated using the MBE methods disclosed herein. The present methods can utilize other materials, such as amorphous oxy-nitrides and metal alloys, for the creation of high-uniformity films with improved growth rate. That is, the physical principles disclosed herein are independent of the surface chemistry specific to the ad-atoms and substrate.

Furthermore, the use of compound semiconductor materials in deposition processes provides the ability to fabricate a plurality of heterogeneous epi-layers sequentially deposited upon a deposition surface. This allows quantum engineered structures to be tailored and optimized for specific electro-optic and electronic applications (e.g., LEDs, lasers, power transistors, and radio-frequency devices).

Accordingly, in the present methods and systems, a material source that is arranged with respect to the formation surface to improve the balance between film quality and film growth rate is suitable for supporting a continuous, high-throughput film formation process using an MBE system. The present disclosure provides improvements over existing systems and methods, which are conventionally characterized by at least one of slow growth rates and low deposition uniformity owing to a physical arrangement of the material source which is fixed by the manufacturer of the MBE system.

Conventional Material Deposition Systems

FIG. 1 is an isometric view of a portion of a high-vacuum reaction chamber 10, as known in the art, that includes a material source 18 that is arranged off-axis and at an angle with respect to a film formation surface 26 of a substrate 22. The high-vacuum reaction chamber 10 may be the reaction chamber of an MBE system 5. A vacuum environment 14 is maintained within the high-vacuum reaction chamber 10 by a vacuum pump 16. For example, the vacuum environment 14 may be in the range of from about $10^{-12}$ torr to about $10^{-7}$ torr, from about $10^{-11}$ torr to about $10^{-9}$ torr, or at about $10^{-11}$ torr to $10^{-5}$ torr. A well-prepared and substantially leak-free reactor has a base pressure and growth pressure (i.e., during deposition) that is directly related to the pumping speed of the reactor and the incident beam pressures generated by the sources.

Material source 18 is arranged with respect to substrate 22 inside of the high-vacuum reaction chamber 10. The substrate 22 may be any base material on which a film or layer of material may be formed. The substrate 22 is rotatable around a center axis of rotation AX. The side of the substrate 22 that is facing the material source 18 provides the film formation surface 26. The substrate 22 has a radius, $R_{SUB}$.

The formation surface 26 is the target of the material delivered from the material source 18. That is, the formation surface 26 is the side of the substrate 22 on which a film may be formed, such as by epitaxy. Epitaxy refers to the deposition of a crystalline overlayer on a crystalline substrate, where the overlayer is registered with the substrate. In other words, there must be one or more preferred crystal orientations of the overlayer with respect to the substrate for this to be termed epitaxial growth. The overlayer is called an epitaxial film or epitaxial layer, and sometimes called an epi-layer.

The material source 18 may be any source of the elemental and pure species from which a film may be formed on the formation surface 26. For example, the material source 18 shown in FIG. 1 may be a Knudsen effusion cell. A typical Knudsen effusion cell includes a shaped crucible (made of high purity pyrolytic boron nitride, fused quartz, tungsten, or graphite), a plurality of resistive heating filaments, a water-cooling system, heat shields to contain the heat within the crucible body, a crucible orifice, and an orifice shutter, none of which are shown but are well known by those skilled in the art. The material source 18 includes an exit aperture 30. In the case of a Knudsen effusion cell, the exit aperture 30 is an opening in the end of the crucible that faces the formation surface 26. As a result of crucible heating, the material (e.g., a liquid) inside the crucible is also heated and material atoms are evaporated (e.g., from the liquid surface). The number of atoms evaporated per unit area per unit of time can be well controlled by controlling the crucible temperature. The evaporant atoms or species are delivered under pressure from the exit aperture 30, travel with a well-defined exit velocity and with a mean free path in excess of the source-to-substrate distance (maintained by the high vacuum level in the reactor), and are directed toward the formation surface 26 where they collide and/or interact with the material of the formation surface 26. That is, a plume 34 of material (or species) that exits the exit aperture 30 of the material source 18 is directed toward the formation surface 26. Plume 34 has an axis of symmetry SA.

Conventional, commercially-available MBE deposition systems utilize material sources that are spatially configured for adequate material flux uniformity on a relatively small deposition plane area—without primary regard for simultaneous optimization of both flux uniformity and growth rate. FIG. 1 schematically depicts the center axis of rotation AX of the substrate. The material source 18 is located a certain lateral distance X from the center axis of rotation AX of the substrate 22, a certain orthogonal (perpendicular) distance Z from the plane of the formation surface 26, and at a virtual flux plane (VFP) tilt angle α with respect to the plane of the formation surface 26. Hence, the material source 18 is an "off-axis" material source. The lateral distance X and the orthogonal distance Z are the coordinates of the material source 18 with respect to the center of the substrate deposition plane 26.

In practice, non-optimal spatial placement of the material source in a conventional MBE system is compensated empirically by increasing the substrate-to-source distance $R_{Src-Sub}$ (i.e., by placing the source substantially further than otherwise necessary for optimal placement). This increased substrate-to-source distance directly results in a decrease in growth rate, which is inversely proportional to the square of the substrate-to-source distance, and a decrease in the utilization of the expelled source material. Additionally, in conventional MBE systems, the plume of species from the material source is typically directed at the center of the formation surface 26.

Conventional MBE systems can be generalized and summarized as a reactor system with a configuration space specified by:

(i) A symmetry axis SA of the material source plume that is arranged to target the absolute center of rotation of the deposition plane;

(ii) The source-to-substrate distance $R_{src-sub}$ and lateral distance X of the source VFP centroid relative to the substrate rotation axis AX, which is configured with cylindrical or spherical symmetry relative to the center of the deposition plane;

(iii) Reactor dimensions proportioned such that $X \leq R_{src-sub}$ and $\beta = \tan^{-1}(X/R_{src-sub}) \leq 45°$, where β is the angle between the vertical axis Z and the symmetry axis SA; and (iv) A virtual flux plane tilt angle limited in the range $0 \leq \alpha \leq 45°$.

Material Deposition System with Optimized Source Placement

Figure 2:
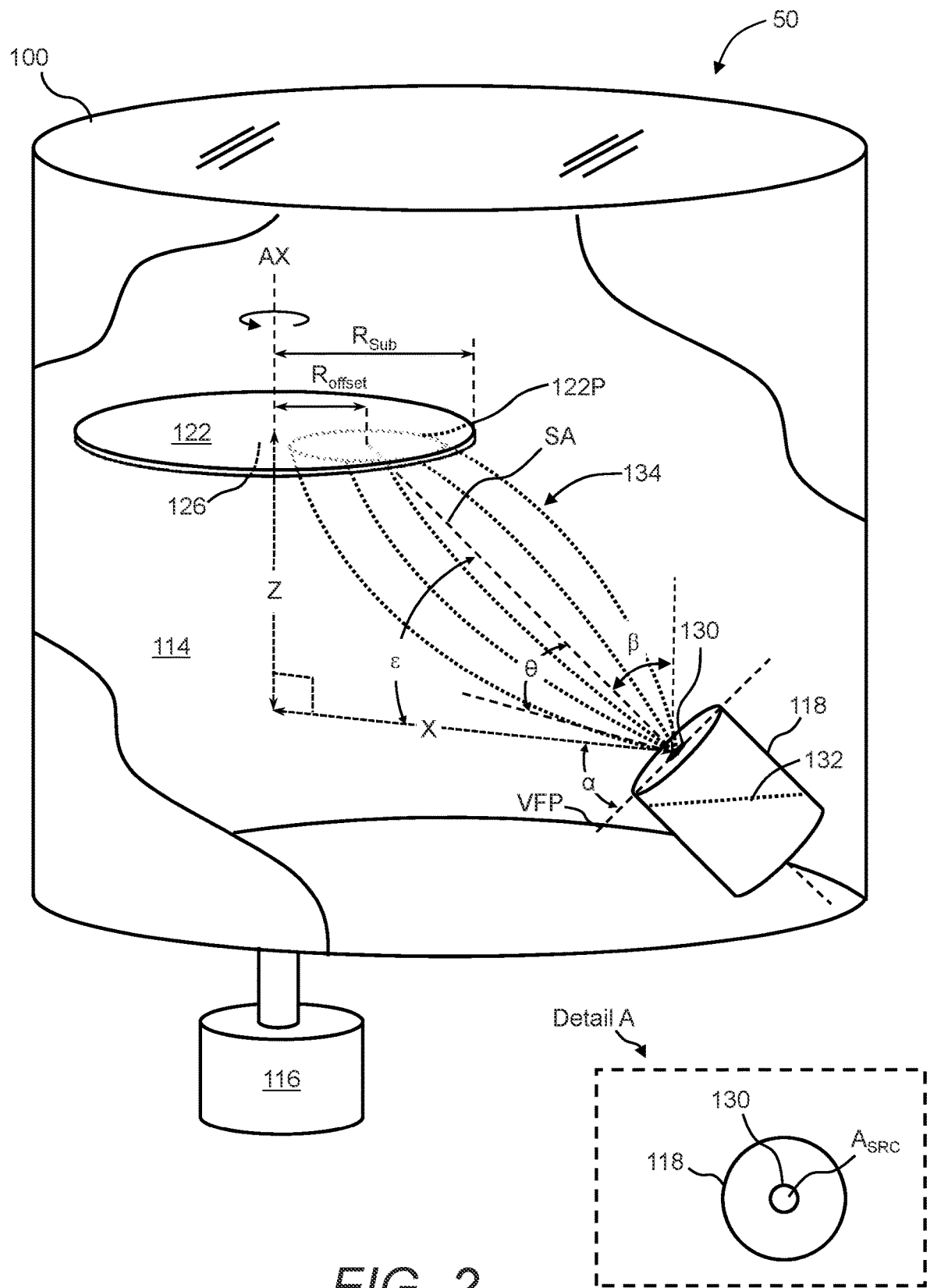
FIG. 2 is an isometric view of a material deposition system, in accordance with some embodiments.

FIG. 2 is an isometric view of a portion of a material deposition system 50, in accordance with some embodiments. The material deposition system 50—which is a molecular beam epitaxy system—has a high-vacuum reaction chamber 100. The material deposition system 50 includes a material source 118 that is arranged off-axis and at an angle with respect to a substrate deposition plane 126 of a substrate 122, and is also offset by an amount $R_{offset}$. That is, the material source 118 has a symmetry axis SA that is aimed at a point offset from the absolute center of the substrate 122 by an amount $R_{offset}$, rather than at the absolute center. The material source 118 deposits the material on an area 122P of substrate deposition plane 126. A vacuum environment 114 is maintained within the high-vacuum reaction chamber 100 by a vacuum pump 116. For example, the vacuum environment 114 may be in the range of from about $10^{-12}$ torr to about $10^{-7}$ torr in one example, from about $10^{-11}$ torr to about $10^{-9}$ torr in another example, or at about $10^{-11}$ torr to $10^{-5}$ torr in yet another example.

Material source 118 is arranged with respect to substrate 122 inside of the high-vacuum reaction chamber 100 to produce deposition layers with high uniformity while maintaining a high throughput. The substrate 122 may be any base material on which a film or layer of material may be formed. For example, the substrate 122 may be a wafer of silicon (e.g., single crystal), sapphire, MgO, or $Ga_2O_3$ with a clean atomic surface. The substrate 122 is rotatable around a center axis of rotation AX. The substrate deposition plane 126 is the side—e.g., the front surface—of the substrate 122 on which a film may be formed, such as by epitaxy. The substrate 122 has a certain radius, $R_{SUB}$. For example, an 8-inch substrate 122 has an $R_{SUB}$ of 4 inches; a 12-inch substrate 122 has an $R_{SUB}$ of 6 inches (approximately 150 mm); and so on. Although the substrate 122 shown in FIG. 1 is circular, the present systems and methods are not limited thereto. For example, the substrate 122 may be square or some other non-circular shape. In another embodiment, the material source 118 is arranged with respect to a platen or the like whereon one or a plurality of substrates is mounted.

Those skilled in the art will recognize that the high-vacuum reaction chamber 100 may include other components (e.g., a substrate heater, a material source aperture, sensing devices, additional vacuum pumping system components, etc.), which are not shown in FIG. 2.

The material source 118 may be any source of the elemental and pure species from which a film may be formed on the substrate deposition plane 126. In some embodiments, the material source may be a plasma source of nitrogen or oxygen. Examples of the material source 118 include: gaseous precursor injectors; preheated gas injectors; Knudsen-type thermally driven crucibles (i.e., Knudsen effusion cells) for containing sublimated solid material or evaporated liquid material; electron beam evaporator heating of source material; and remote plasma activated sources (i.e., sources wherein the plasma region is wholly contained within the source and does not extend from the source toward the substrate surface) for gaseous feedstock. In one example, when aluminum (Al) is the material to be epitaxially grown on the substrate deposition plane 126, the material source 118 may be a Knudsen effusion cell that contains substantially pure aluminum contained in a substantially non-interacting crucible.

The material source 118 includes an exit aperture 130 and material level 132 of the material in the material source 118. In the case of a Knudsen effusion cell, the exit aperture 130 is an opening in the end of the crucible that faces the substrate deposition plane 126. A plume 134 of material (or species) that exits the exit aperture 130 of the material source 118 is directed toward the substrate deposition plane 126. In another embodiment, the material source 118 includes a plurality of outlets (exit apertures 130).

The position of material source 118 relative to the substrate 122 is dynamically adjustable such that the tilt angle, lateral distance, and/or orthogonal distance of material source 118 with respect to substrate 122 can be changed between production runs to achieve a desired layer deposition uniformity and desired layer growth rate. The settings for tilt angle, lateral distance, and orthogonal distance will depend on the material ejection spatial distribution of the material source. The positioning may also be affected using multiple material sources at the same time, that emit different materials from each other. In some embodiments, the tilt angle for the material source may be set first, and minimum values for the orthogonal distance and the lateral distance can be determined using the set tilt angle. In other embodiments, the orthogonal distance and the lateral distance may be set first, and the tilt angle can be determined for achieving the desired layer deposition uniformity for a desired growth rate. In some embodiments, the position of the material source 118 is movable while the substrate 122 is fixed; or the substrate 122 may be movable instead of or in addition to the material source 118. For example, a positioning mechanism may be coupled to the material source, the substrate, or both the material source and the substrate. The positioning mechanism may be, for example, a bracket that is secured along a slot, an arm or a post that has an adjustable length, a linear actuator, or a combination of these.

The plume 134 of material (or species) is a flux of substantially non-interacting particles, which has a spatial beam flux profile (BFP) that can be characterized by an angular distribution of species being emitted in a forward direction from the material source 118. The BFP can also be referred to as a predetermined material ejection spatial distribution of the material sources. The beam flux profile is characterized by the relationship of the BFP angle θ with respect to the symmetry axis SA of the plume 134. Therefore, the material source 118 may be approximated and characterized by having a certain cosine N factor. The cosine N factor is described in greater detail with reference to FIG. 3.

Figure 3:
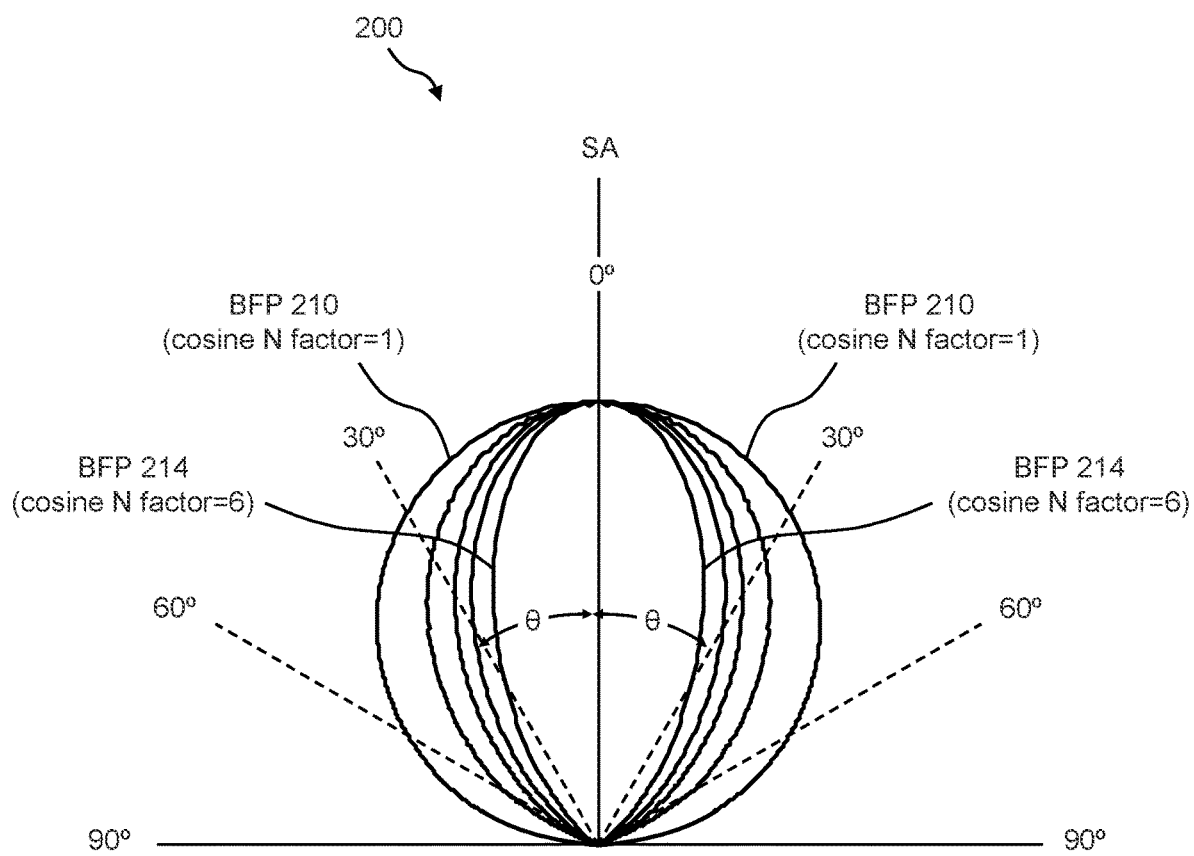
FIG. 3 is a plot of examples of beam flux profiles that correspond to certain cosine N factors of a material source, in accordance with some embodiments.

FIG. 3 is a plot 200 of examples of beam flux profiles that correspond to certain cosine N factors of a material source. The plot 200 shows the angular beam dispersion of certain beam flux profiles as a function of BFP angles θ. For example, the plot 200 shows a BFP 210, which has a cosine N factor of 1, is substantially spherical, and is considered an isotropic point source. BFPs that have a $cos^N(\theta)$ with N>1 are more directional, as shown in FIG. 3. For example, the plot 200 shows a BFP 214, which has a cosine N factor of 6 and is a beam flux profile that is elongated and narrower than BFP 210, rather than spherical. The plot 200 also shows examples of other BFPs between BFP 210 and BFP 214 that have cosine N factors between 1 and 6. By way of example, sources with a cosine N factor of 1 and a cosine N factor of 6 differ in that 80% of the forward projected beam is contained within an angular range of ±36.4° and ±15.5°, respectively. Accordingly, an improved flux utilization can be achieved by judicious choice of cosine N factor material source and relative configuration position to the rotating deposition plane. For example, the use of sources with cosine N factors are more directional, thus reducing the amount of material that is wasted.

The material source 118 may be any source characterized by a cosine N factor. This cosine N factor characterization is independent of the type of source, whether material source 118 is a liquid source that is evaporating material, a sublimation source that is sublimating material, a gas source, or the like.

Conventional MBE systems utilize a material source that has a cosine N factor ranging from about 1 to about 2. It is widely believed by those skilled in the art that a substantially spherical plume is advantageous for high flux uniformity. Furthermore, in conventional material sources the effective cosine N factor can change as a function of source material depletion. This results in a change of spatial flux non-uniformity across the deposition plane as the source material depletes, and this problem is exacerbated if the material source is configured in a sub-optimal position relative to the deposition plane. Therefore, in the present embodiments it is desirable to design deposition reactors with optimal source configurations that are tolerant of variations in effective cosine N factors.

Additionally, in conventional MBE systems, the material source is placed a relatively long distance from the formation surface and typically well in excess of the optimal distance. Prior art systems typically employ $R_{src-sub}$ well in excess of deposition plane diameter (i.e., $R_{src-sub} \gg 2R_{sub}$ for $\alpha < 45°$). The typical BFP of conventional material sources characterized by cosine N factors $1 < N \leq 2$, coupled with the long distance that the species comprising the source beam must travel, results in at least one of a: (1) sub-optimal growth rate; (2) poor flux uniformity across the entire deposition plane; (3) a large amount of residual background impurity species, which can deleteriously affect the deposited film; and (4) poor flux utilization as measured by the ratio of total emitted flux from the source to flux that intersects the deposition plane. That is, the species from the material source in conventional systems tends to be emitted throughout a substantial volume of the chamber as opposed to being directed toward the formation surface.

In the present methods and systems, the symmetry axis SA of the plume 134 generated by the material source 118 is directed toward a well-defined portion of the periphery of the substrate deposition plane 126 of the substrate 122. Specifically, the symmetry axis SA of the plume 134 is offset, being directed at a point spaced apart from the center of rotation of the substrate deposition plane 126. That is, the material source 118 has a symmetry axis SA that intersects the substrate 122 at a point spaced apart from the axis of rotation AX, by an amount $R_{offset}$.

In addition, the lateral distance X and the orthogonal distance Z that represent the placement of the material source 118 from the center axis of rotation AX of the substrate deposition plane of the substrate 122, are scaled to $R_{SUB}$. The relationship of the lateral distance X and the vertical distance Z to $R_{SUB}$ may be used for scaling the size of the high-vacuum reaction chamber 100. Enabling material sources 118 in a reaction chamber 100 to be closer to the substrate 122 allows the overall size of the reaction system (material deposition system 50) to be smaller, thus reducing costs.

The exit aperture 130, which is the outlet of the material source 118, has an effective area $A_{src}$, as shown in a Detail A of FIG. 2. The effective area $A_{src}$, can be defined by a radius $R_{src}$. The exit aperture 130, which has the effective area $A_{SRC}$, can be characterized or designed as a plurality of independent cosine N elemental sources. For example, an integer number in of the elemental sources indexed by $i=\{1, \ldots, j, \ldots, m\}$, wherein $m>1$, are each characterized by a predetermined material ejection spatial distribution (the BFP) given by $\cos^{N_i}(\theta_i)$. The elemental sources may be chosen such that $N_i$ is constant for all values of i, or at least two dissimilar elemental sources may be chosen with $N_i \neq N_j$.

In one example of determining placement of a material source in a material deposition system, a circular substrate deposition plane 126 that has a radius $R_{SUB}=1.5$ may be used to represent a 300 mm diameter substrate 122. A compound source (i.e., material source) of circular area defined by a radius $R_{SRC}=0.2$ is positioned in the positive z-direction half space relative to the substrate deposition plane 126 with center positioned at $S_0$ ($S_{0x}$, $S_{0y}$, $S_{0z}$) and with a VFP tilt angle $\alpha=45°$. The source is discretized in three radial steps of $\Delta\rho_{SRC}=0.1$ with discretized elements placed at angular intervals of $\Delta\theta_{SRC}=36°$, thereby forming a compound source plane with 21 elements. Each source of the elements is modeled as a modified cosine emitter $$\left(\cos\phi_{\vec{n}_{src}-\vec{P}_{DP}^i}\right)^{N_{cell}}.$$

Each source element on the VFP emits flux directed toward the substrate deposition plane 126 parallel to the surface normal $\vec{n}_{src}$ of VFP. The intersection of the directed flux segment with a general point P on the substrate deposition plane 126 is then calculated along with the Euclidean distance norm $$[\vec{R}_{P_{DP}^i}^i - \vec{s}_{src}^i].$$

The substrate 122 or the substrate deposition plane 126 is similarly discretized with radial and angular increments of $\Delta R_{SUS}=0.1$ and $\Delta\theta_{SUB}=10°$, thereby providing a sampling mesh of 541 points with Cartesian co-ordinates $P(x_{SUB}, y_{SUB}, z_{SUB})$.

The vacuum environment of the material deposition system is sufficient for the mean free path length for maintaining a ballistic particle regime of a material ejected from the source aperture being greater or equal to the Euclidean distance between the material source exit aperture and the point on the deposition plane that is intersected by symmetry axis of the material ejection spatial distribution. Suitably high vacuum conditions are provided in which residual background impurity species within the reaction chamber are significantly reduced. The cosine N factor of a material source also has a direct effect on the amount of residual background impurity species within a reaction chamber for a given vacuum level. Assuming the source material is composed of sufficiently high purity material, then the impurity concentration subsequently available to be incorporated into a growing film (i.e., to form an additional undesirable impurity flux component to the desirable material source flux) will primarily depend upon the deposition rate and the vacuum level maintained during deposition. That is, for a given base vacuum level in the reactor prior to the introduction of the source material flux, there is a quantifiable amount of time in which a well-prepared and clean deposition surface will accumulate an undesirable impurity surface coverage. It is therefore desirable to simultaneously achieve a small flux non-uniformity, high growth rate, and low background impurity concentration.

In the present disclosure, the material source 118, which is an offset source, provides both an improved flux non-uniformity across the entire substrate deposition plane 126 and a reduced source-to-substrate distance, as compared with conventional MBE systems. That is, optimal positions are determined for a given material source type that achieve a reduced flux non-uniformity and increased growth rate for a given substrate deposition plane 126 area, as compared with conventional MBE systems.

Further, the present embodiments provide an optimal configuration space of material source(s) utilized in high vacuum reactors explicitly for large area deposition plane utility. Additionally, large deposition area reactors can be further optimized according to the methods by judicious choice of material source characteristics, such as effective cosine-N factor with $N \geq 2$ and source VFP area.

In some embodiments, the material source 118 has a cosine N factor ranging from $0 < N \leq 10$, such as ranging from $2 \leq N \leq 6$. Additionally, in embodiments the material source 118 is positioned optimally and close to the substrate deposition plane 126 in comparison to prior art non-optimal configurations. As a result, the ejected plume 134 of deposition species are deposited with higher efficiency onto the substrate deposition plane 126 than would be the case in conventional MBE systems. A significantly shorter distance of travel of source material species provides an inverse square increase in the deposition species accumulation rate at the deposition surface. This leads to a significantly lower mean free path required for the deposition species ejected from the material source and therefore enables a substantially collision free regime to be maintained at a higher working pressure (i.e., at a lesser vacuum level). Yet a further advantageous property of improved growth rate is a reduced impact of residual background impurity species within the deposited film.

"Source utilization" refers to the amount (i.e., in terms of volume) of the material being physically ejected out of the material source 118 that intersects the substrate deposition plane 126. Conventional off-axis MBE reactor configurations achieve at most approximately 25% source utilization. In contrast, because the present embodiments provide a plume 134 which is spatially configured for an optimized target flux non-uniformity, the accumulation rate at the maximized and thus a higher flux utilization is realized. Furthermore, the present embodiments use a higher directional material source (e.g., with a cosine N factor of up to about 6) than in conventional MBE (e.g., with a cosine N factor of about 1 to 2). Therefore, when configured optimally the present embodiments provide yet a further increase in source utilization. For example, the source utilization using the present embodiments may be from about 30% to about 50%. Therefore, the present embodiments result in a film formation process that is more efficient than conventional MBE and achieve the optimal target flux non-uniformity with highest accumulation rate in comparison with conventional MBE.

Furthermore, the present embodiments provide optimal high vacuum conditions for maintaining sufficiently large mean free paths of film formation species, which enable high quality epitaxial films to be formed. The mean free path is the average distance covered by a moving particle (e.g., an atom, a molecule, a photon) between successive impacts (or collisions), which modify its direction, energy, or other properties. More specifically, the embodiments provide high vacuum conditions for maintaining a mean free path of film formation species that is greater than the distance of the material source 118 from the substrate deposition plane 126. For example, in order to provide a mean free path of Al atoms of $L_{MFP}=1$ meter for an example case of a material source beam comprised exclusively of elemental Al atoms producing a flux of $\Phi_{Al}=5\times10^{19}$ atoms·m$^{-2}$·s$^{-1}$ directed into a reactor that is homogeneously filled entirely of inert molecular nitrogen (N$_2$) at 300° K, the maximum working chamber pressure is limited to $10^{-6}$ torr and is preferably less. In practice, the longest unimpeded optical path length an atom is required to traverse from the source to the deposition plane should be at most $L_{MFP}/2$. Yet a further limitation is the effect of the background impurity type and level specific to the type of film to be deposited. The present embodiments can achieve high-quality films if the growth rate (i.e., the time $\tau_{ML}$ for accumulating one monolayer of desired material on the deposition plane) is desired to be at least a factor $\lambda \geq 10^3-10^4$ times faster than the time $\tau_{imp}$ (i.e., $\tau_{imp} \geq \lambda \cdot \tau_{ML}$) required to accumulate an equivalent monolayer of impurity species. This places an upper limit to the acceptable residual impurity pressure within the reactor to be of the order of $10^{-9}-10^{-10}$ torr.

Therefore, the mean free path of ejected species generated by the material source is assumed to be ballistic and collision free until interaction with the deposition plane. Furthermore, the base pressure of the reactor is assumed to be free of impurity species and not contributing to the flux profile generated at the deposition plane.

Referring again to FIG. 2 and FIG. 3, methods of configuring a material deposition system involve determining the position of a material source for the purpose of improving the balance between film quality and film growth rate. More than one material source can be optimized, where the symmetry axes of each of the material sources are directed at a point that is offset from the axis of rotation of the substrate. For example, embodiments include determining a minimum lateral distance X and a minimum orthogonal distance Z for a given material source and tilt angle, where the material source has given parameters such as an exit aperture and material ejection spatial distribution (e.g., a given cosine N factor). In another example, embodiments include determining a tilt angle for a given material source and a given lateral distance X and orthogonal distance Z, where the material source has given parameters such as an exit aperture and material ejection spatial distribution (e.g., a given cosine N factor). In some embodiments, a proposed material source position (and/or angle) can be tested, and one or more of the tilt angle α, lateral distance, orthogonal distance, desired growth rate and exit aperture geometry can be dynamically modified after testing to meet the desired layer uniformity. In some embodiments, if the desired layer uniformity is not met—e.g., is deemed not to be achievable—the desired layer uniformity can be changed to a new value and then new material source position parameters are determined to meet the new value. In some embodiments, calculation of the relative position between the material source and substrate can be performed for a plurality of material sources being used together. That is, in some embodiments the determining of a position of a material source accounts for when the material source and the additional material sources are used together. The present methods are described in greater detail with reference to FIG. 8.

Optimization of Material Source Placement

FIG. 4 through FIG. 7 are examples of plots of the configuration space for certain positions of the material source 118 relative to the substrate deposition plane 126, where the calculated film non-uniformity is plotted as a function of the coordinates X and Z of the material source 118. The configuration spaces shown in the respective plots of FIG. 4 through FIG. 7 are unique with respect to a certain VFP tilt angle α, a certain cosine N factor of the material source 118, and a certain $R_{SUB}$ of the substrate deposition plane 126 (indicating the area of film formation). The methods are not limited to only those configuration spaces shown in the plots of FIG. 4 through FIG. 7; these configuration spaces are examples only. A configuration space exists for any combination of VFP tilt angle α, cosine N factor, and $R_{SUB}$ value that is suitable for supporting a continuous, high-throughput film formation process using MBE. Table 1 shows the configuration spaces that correspond to the plots shown in FIG. 4 through FIG. 7.

TABLE 1

Example configuration spaces

Figure 4:
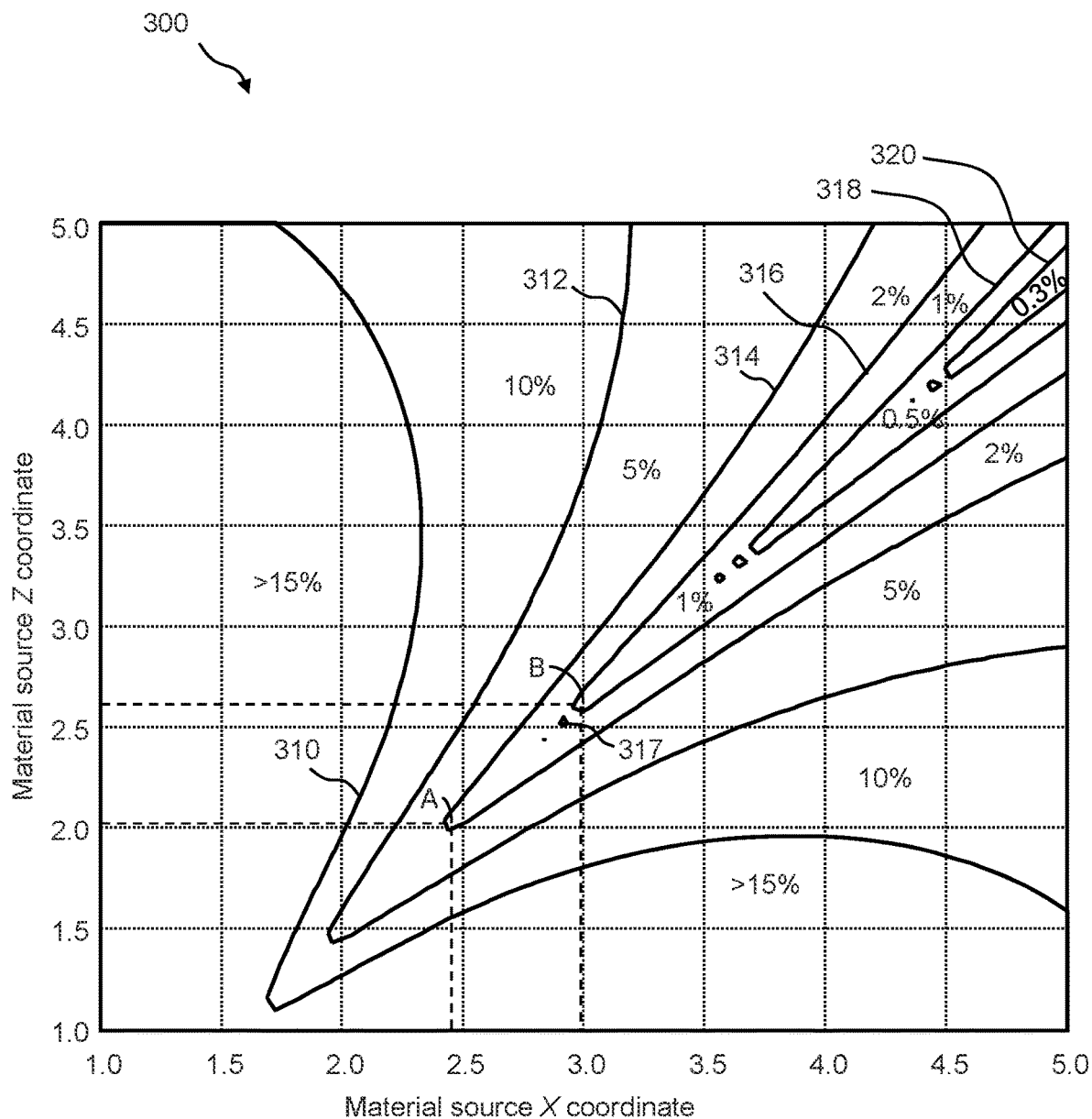
FIG. 4 through FIG. 7 are examples of plots of the configuration space for certain positions of the material source relative to the formation surface, where the calculated film non-uniformity is plotted as a function of the coordinates X and Z of the material source, in accordance with some embodiments.
Figure 5:
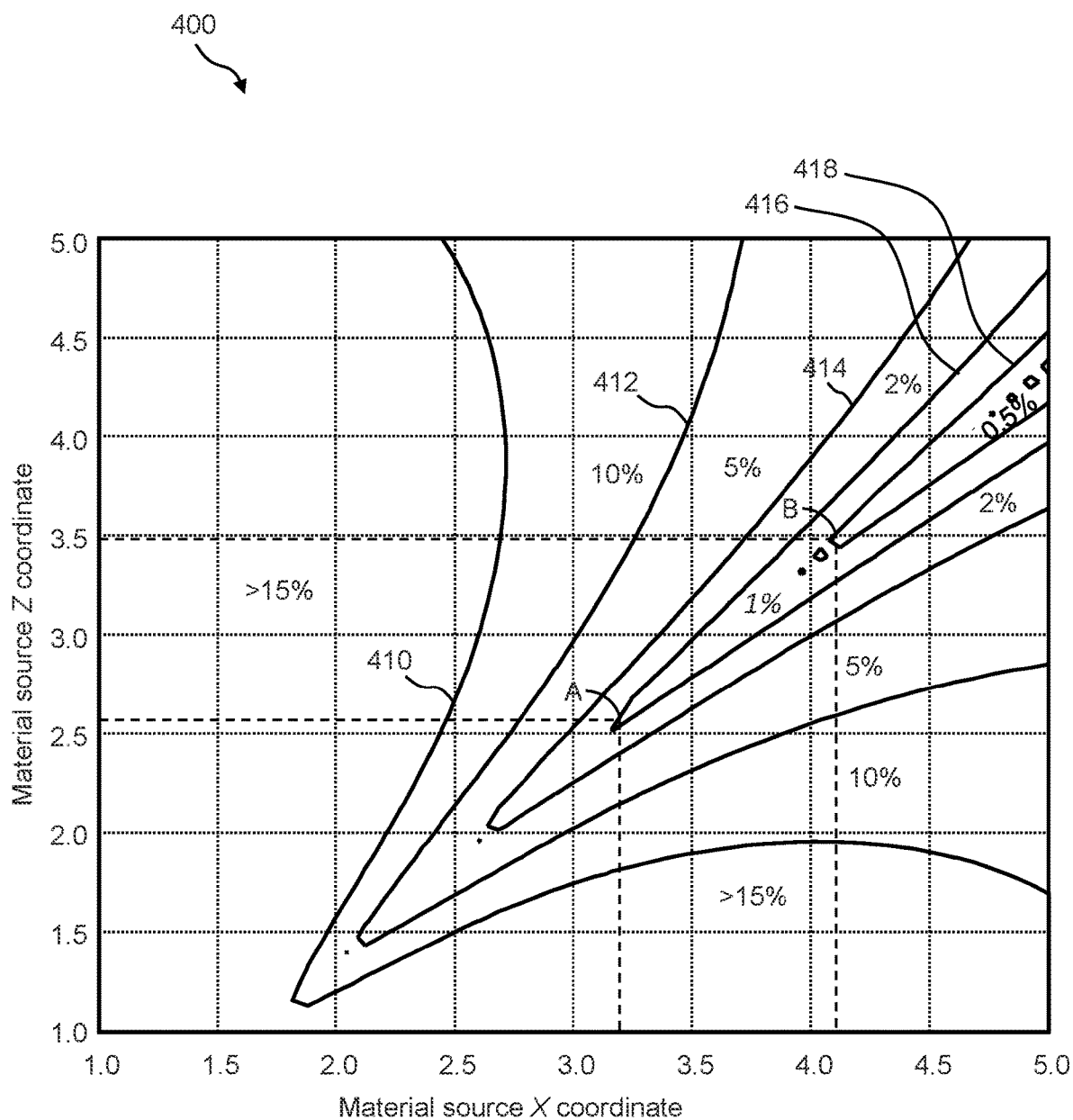
Figure 6:
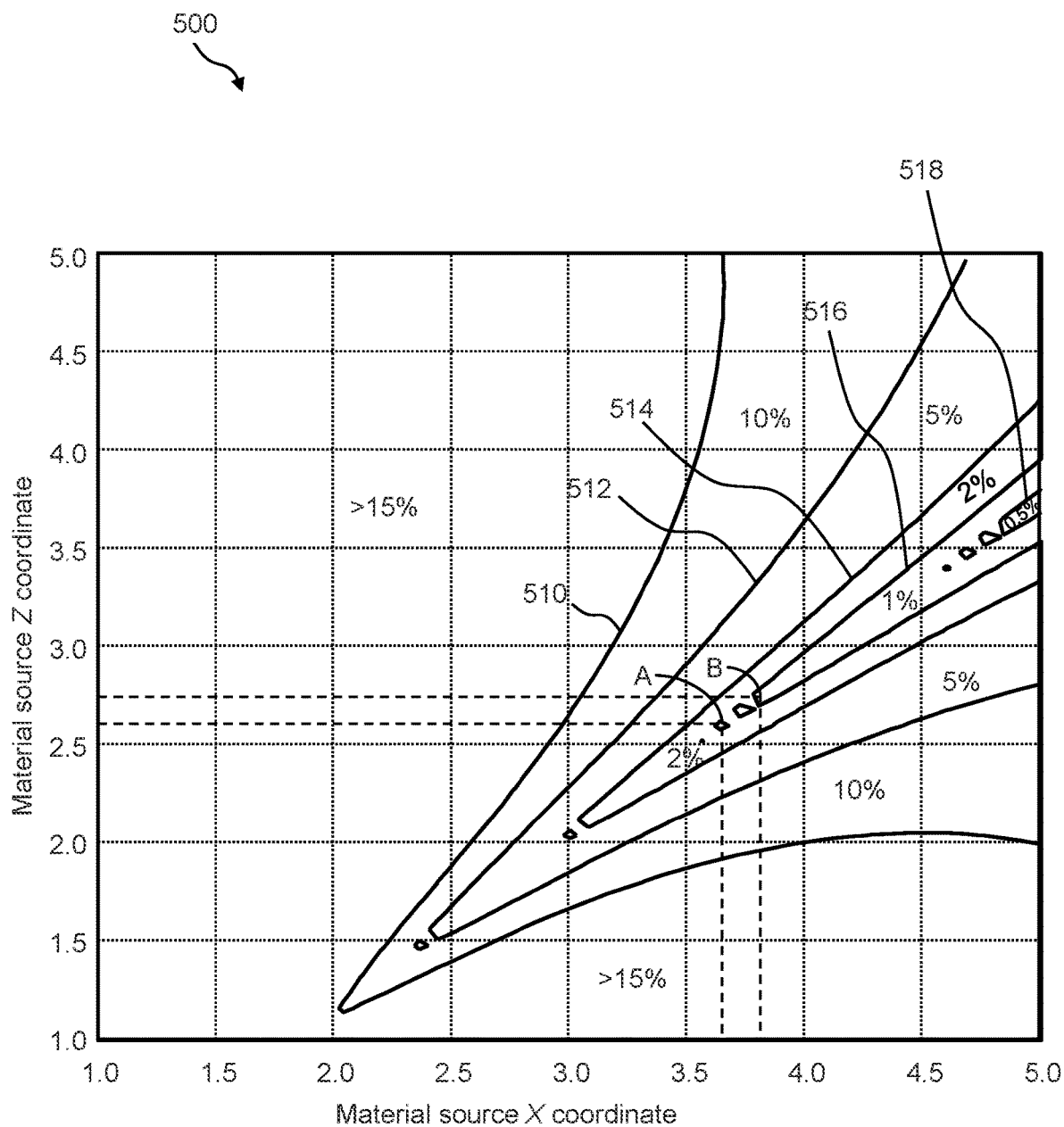
Figure 7:
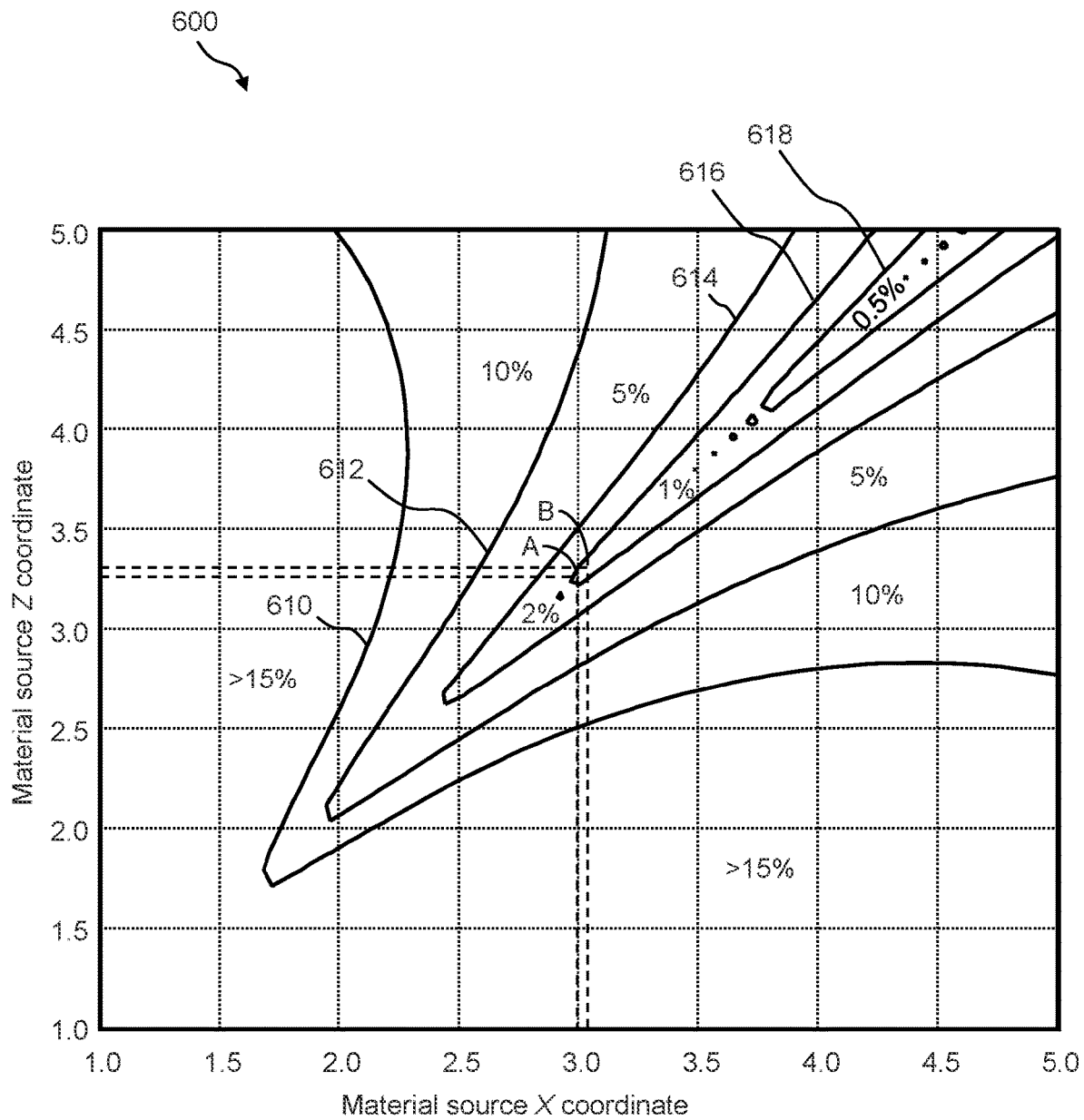

| | VFP Tilt Angle α | Cosine N Factor | $R_{SUB}$ |
|---|---|---|---|
| Plot 300 of FIG. 4 | 45° | 2 | 1.5 |
| Plot 400 of FIG. 5 | 45° | 3 | 1.5 |
| Plot 500 of FIG. 6 | 45° | 6 | 1.5 |
| Plot 600 of FIG. 7 | 30° | 3 | 1.5 |

In FIG. 4, a plot 300 shows the configuration space for positions of the material source 118 when the cosine N factor=2, the VFP tilt angle α=45°, and the $R_{SUB}$=1.5. Note that the X coordinate, the Z coordinate, and $R_{SUB}$ in the plot 300 are dimensionless. The plot 300 shows a >15% film non-uniformity area, a 10% film non-uniformity area, a 5% film non-uniformity area, a 2% film non-uniformity area, a 1% film non-uniformity area, a 0.5% film non-uniformity area, and a 0.3% film non-uniformity area, each of which is plotted as a function of the distances X and Z of the material source 118 with respect to the substrate deposition plane 126. A curve 310 forms the boundary between the >15% and 10% film non-uniformity areas. A curve 312 forms the boundary between the 10% and 5% film non-uniformity areas. A curve 314 forms the boundary between the 5% and 2% film non-uniformity areas. A curve 316 forms the boundary between the 2% and 1% film non-uniformity areas. A curve 318 forms the boundary between the 1% and 0.5% film non-uniformity areas. A curve 320 forms the boundary between the 0.5% and 0.3% film non-uniformity areas. Note that certain islands 317 of 1% film non-uniformity may exist in the 2% film non-uniformity area (i.e., near the apex of the curve 316). Also, certain islands of 0.5% film non-uniformity may exist in the 1% film non-uniformity area (i.e., near the apex of the curve 318). Also, certain islands of 0.3% film non-uniformity may exist in the 0.5% film non-uniformity area (i.e., near the apex of the curve 320).

For a given non-uniformity value, the fastest growth rate may be achieved by providing the shortest distance possible from the exit aperture 130 of the material source 118 to the substrate deposition plane 126. Therefore, the fastest growth rate may be achieved by selecting a point in the given non-uniformity area that provides the shortest possible X and Z distances (i.e., where $R_{src-sub}=(X^2+Z^2)^{1/2}$ is minimized). Short X and Z distances are desired because the shorter the source-to-formation surface distance, the higher the growth rate, namely, the higher the throughput of the MBE system. By way of example and referring to the plot 300, if 2% non-uniformity is the target of the film formation process and the highest growth rate possible is desired, a point A, which is near the apex and just inside of the curve 314, is selected to achieve the shortest possible distances X and Z, which in turn achieves the highest possible growth rate. In this example and corresponding to the point A, the material source 118 (which has a cosine N factor=2) having a VFP tilt angle α=45° is set at a distance X of about 2.4 and a distance Z of about 2 to achieve about 2% non-uniformity. In another example and corresponding to a point B, the material source 118 (which has a cosine N factor=2) having a VFP tilt angle α=45° is set at a distance X of about 3 and a distance Z of about 2.6 to achieve the highest possible growth rate at about 1% non-uniformity.

In FIG. 5, a plot 400 shows the configuration space for positions of the material source 118 when the material source 118 cosine N factor=3, the VFP tilt angle α=45°, and the $R_{SUB}$=1.5. Note that the X coordinate, the Z coordinate, and $R_{SUB}$ in the plot 400 are dimensionless. The plot 400 shows a >15% film non-uniformity area, a 10% film non-uniformity area, a 5% film non-uniformity area, a 2% film non-uniformity area, a 1% film non-uniformity area, and a 0.5% film non-uniformity area that are plotted as a function of the coordinates X and Z of the material source 118. A curve 410 forms the boundary between the >15% and 10% film non-uniformity areas. A curve 412 forms the boundary between the 10% and 4% film non-uniformity areas. A curve 414 forms the boundary between the 4% and 2% film non-uniformity areas. A curve 416 forms the boundary between the 2% and 1% film non-uniformity areas. A curve 418 forms the boundary between the 1% and 0.5% film non-uniformity areas. Note that certain islands of 0.5% film non-uniformity may exist in the 1% film non-uniformity area (i.e., near the apex of the curve 418).

In one example and corresponding to a point A of the plot 400, the material source 118 (which has a cosine N factor=3) that has a VFP tilt angle α=45° is set at a distance X of about 3.2 and a distance Z of about 2.6 to achieve about 1% non-uniformity. In another example and corresponding to a point B of the plot 400, the material source 118 (which has a cosine N factor=3) that has a VFP tilt angle α=45° is set at a distance X of about 4.2 and a distance Z of about 3.5 to achieve about 0.5% non-uniformity. Thus, for a 1% non-uniformity, the material source 118 should be positioned at greater X distance for a cosine factor of 3 (point A of plot 400) than for a cosine factor of 2 (point B of plot 300).

In FIG. 6, a plot 500 shows the configuration space for positions of the material source 118 when the material source 118 cosine N factor=6, the VFP tilt angle α=45°, and the $R_{SUB}$=1.5. Note that the X coordinate, the Z coordinate, and $R_{SUB}$ in the plot 500 are dimensionless. The plot 500 shows a >15% film non-uniformity area, a 10% film non-uniformity area, a 5% film non-uniformity area, a 2% film non-uniformity area, a 1% film non-uniformity area, and a 0.5% film non-uniformity area that are plotted as a function of the coordinates X and Z of the material source 118. A curve 510 forms the boundary between the >15% and 10% film non-uniformity areas. A curve 512 forms the boundary between the 10% and 5% film non-uniformity areas. A curve 514 forms the boundary between the 5% and 2% film non-uniformity areas. A curve 516 forms the boundary between the 2% and 1% film non-uniformity areas. A curve 518 forms the boundary between the 1% and 0.5% film non-uniformity areas. Note that certain islands of 5% film non-uniformity may exist in the 10% film non-uniformity area (i.e., near the apex of the curve 512). Also, certain islands of 2% film non-uniformity may exist in the 5% film non-uniformity area (i.e., near the apex of the curve 514). Also, certain islands of 1% film non-uniformity may exist in the 2% film non-uniformity area (i.e., near the apex of the curve 516). Also, certain islands of 0.5% film non-uniformity may exist in the 1% film non-uniformity area (i.e., near the apex of the curve 518).

In one example and corresponding to a point A of the plot 500, the material source 118 (which has a cosine N factor=6) that has a VFP tilt angle α=45° is set at a distance X of about 3.6 and a distance Z of about 2.6 to achieve about 1% non-uniformity. In another example and corresponding to a point B of the plot 500, the material source 118 (which has a cosine N factor=6) that has a VFP tilt angle α=45° is set at a distance X of about 3.7 and a distance Z of about 2.7 to also achieve about 1% non-uniformity, but at a slightly lower growth rate than that of the point A. Thus, for a 1% non-uniformity, the material source 118 should be positioned at an even greater X distance for a cosine factor of N=6 (point A or B of plot 500) than for a cosine factor of 3 (point A of plot 400) than for a cosine factor of 2 (point B of plot 300).

In FIG. 7, a plot 600 shows the configuration space for positions of the material source 118 when the VFP tilt angle α=30°, the material source 118 cosine N factor=3, and the $R_{SUB}$=1.5. Note that the X coordinate, the Z coordinate, and $R_{SUB}$ in the plot 600 are dimensionless. The plot 600 shows a >15% film non-uniformity area, a 10% film non-uniformity area, a 5% film non-uniformity area, a 2% film non-uniformity area, a 1% film non-uniformity area, and a 0.5% film non-uniformity area that are plotted as a function of the coordinates X and Z of the material source 118. A curve 610 forms the boundary between the >15% and 10% film non-uniformity areas. A curve 612 forms the boundary between the 10% and 5% film non-uniformity areas. A curve 614 forms the boundary between the 5% and 2% film non-uniformity areas. A curve 616 forms the boundary between the 2% and 1% film non-uniformity areas. A curve 618 forms the boundary between the 1% and 0.5% film non-uniformity areas. Note that certain islands of 1% film non-uniformity may exist in the 2% film non-uniformity area (i.e., near the apex of the curve 616). Also, certain islands of 0.5% film non-uniformity may exist in the 1% film non-uniformity area (i.e., near the apex of the curve 618).

In one example and corresponding to a point A of the plot 600, the material source 118 (which has a cosine N factor=3) that has a VFP tilt angle $\alpha=30°$ is set at a distance X of about 3 and a distance Z of about 3.3 to achieve about 1% non-uniformity. In another example and corresponding to a point B of the plot 600, the material source 118 (which has a cosine N factor=3) that has a VFP tilt angle $\alpha=30°$ is set at a distance X of about 3.05 and a distance Z of about 3.35 to also achieve about 1% non-uniformity, but at a slightly lower growth rate than that of the point A. Comparing points A or B of plot 600 to point A of plot 400, it is seen that for the same cosine factor N=3, changing the tilt angle $\alpha$ from 30° to 45° affects the X and Z distances to achieve a 1% non-uniformity target.

Figure 8:
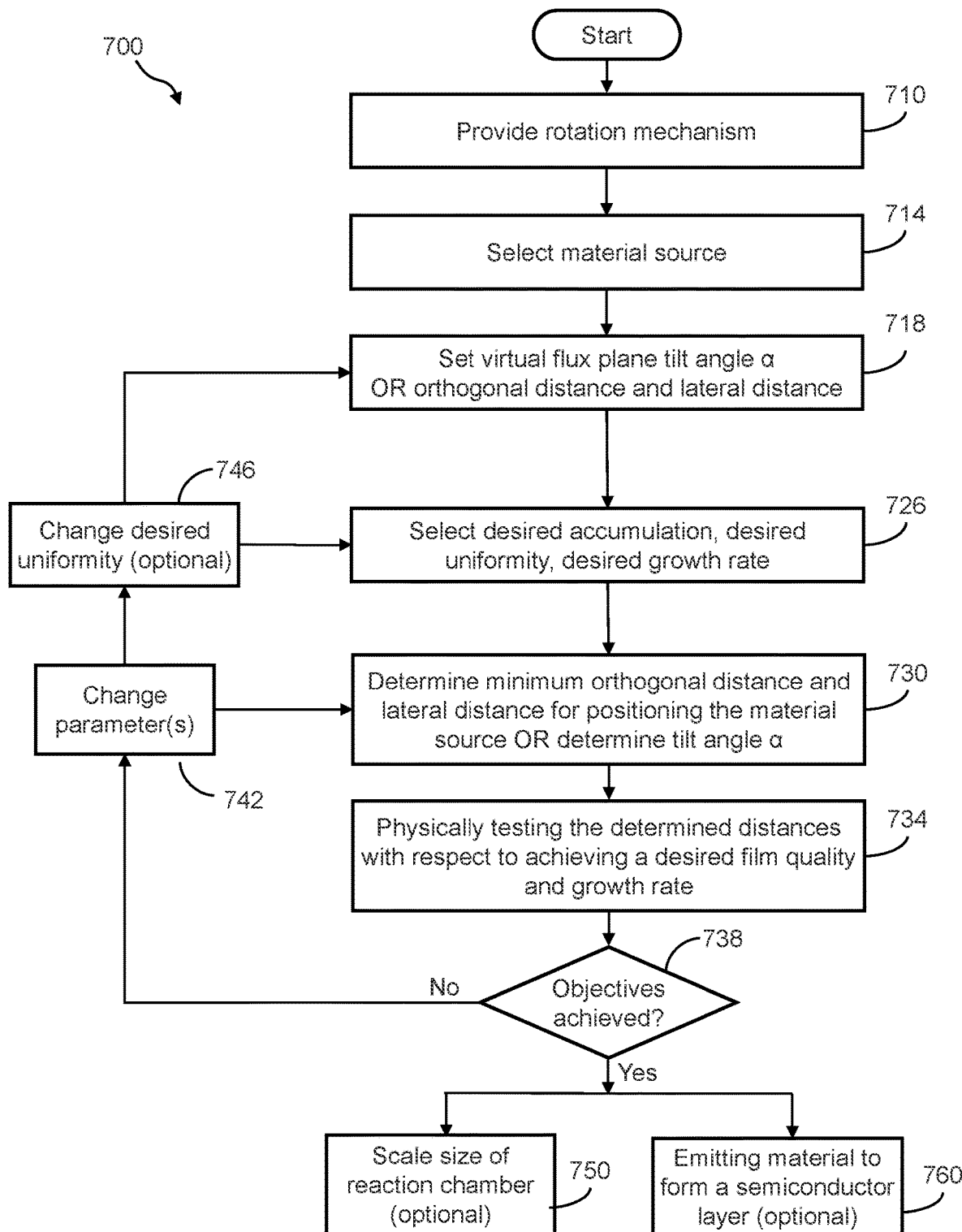
FIG. 8 is a flow diagram of an example of a method of configuring an off-axis source in a high-vacuum reaction chamber to improve the balance between film quality and film growth rate, in accordance with some embodiments.

FIG. 8 is a flow diagram of an example of a method 700 of configuring an offset material source in a material deposition system to improve the balance between film quality and film growth rate. Embodiments of the methods involve choosing values for certain variables and mathematically modeling the material deposition process to optimize the other variables. For example, for a given material source type and tilt angle, the lateral distance X and orthogonal distance Z can be optimized—such as minimizing X and Z to achieve a desired layer deposition uniformity for a desired layer growth rate. In other example embodiments, the distances X and Z may be fixed, and the tilt angle may be determined for achieving the desired layer deposition uniformity for the desired growth rate. In yet other embodiments, the size of the substrate ($R_{SUB}$) or the type of cosine N source may be changed to meet the desired deposition uniformity and growth rate.

Conventional MBE systems are characterized by using relatively slow growth rates as the means to achieve precise epi-layer thicknesses, high-uniformity flux, abrupt interfaces between heterogeneous epi-layers, high-uniformity films, high-structural films, and high-electronic-quality crystalline films. For example, the growth rate in conventional MBE systems may be from about 0.1 monolayers per second (ML/s) to about 10 ML/s. Furthermore, MBE systems typically require a specialized, but straightforward, high vacuum preparation method to achieve the low residual base pressures required for low non-intentional impurity incorporation in the deposited films. This upfront investment in reactor preparation toward the achievement of a vacuum state that is suitable for high quality epitaxy is a key differentiator when making a comparison with high pressure CVD reactors. Furthermore, material sources (such as solid-liquid effusion-type sources) require front-end atmospheric preloading into the reactor, and the material sources subsequently become inaccessible once reactor vacuum is once again attained. Therefore, high-throughput film formation processes require high flux utilization efficiency to manage epi-layer cost per unit area ($/m²) for a given lifetime and total deposited film thickness of a material source campaign. Yet a further desired property is the scalability of reactor size to increase the total deposition area for a given deposition cycle while maintaining low flux non-uniformity. This enables the cost per area (e.g., $/m²) and cost of ownership to be further reduced. It is understood that an increased deposition surface area may contain a single large area substrate or a plurality of smaller substrates advantageously positioned across the deposition plane.

In conventional MBE systems, there is a direct correlation between growth rate and the distance between the material source and the formation surface (hereafter called source-to-formation surface distance). More specifically, the shorter the source-to-formation surface distance, the faster the potential growth rate. The longer the source-to-formation surface distance, the slower the growth rate. Therefore, to achieve high uniformity films, conventional MBE systems implement slow growth rates by placing the material source a long distance from the formation surface in excess of the optimal position as taught herein. Consequently, to achieve high growth rates in conventional MBE systems, the source-to-formation surface distance must be significantly reduced, but doing so has in general compromised the film uniformity across the deposition plane and limited the maximum deposition surface area (i.e., limited the scalability of the process).

By contrast, the method 700, in accordance with some embodiments, provides a technique for implementing high growth rates in an MBE process while still achieving high quality films. In one example, the method 700 provides a film that has about 95% uniformity of thickness across the deposition plane (i.e., about 5% non-uniformity). In another example, the method 700 provides a film that has about 99% uniformity (i.e., about 1% non-uniformity). The method 700 may include the following steps.

At a step 710, a rotation mechanism is provided. The rotation mechanism rotates a substrate around a center axis of a substrate deposition plane of the substrate. In some embodiments, the substrate has a diameter of equal to or greater than 6 inches (150 mm).

At a step 714, the material source is selected, including the elemental species of the material and the type of material source. The material source and the substrate are contained within a vacuum environment. In one example of choosing a material source, if the film to be formed includes gallium, the species selected are gallium species. In another example, if the film to be formed includes aluminum, the species selected are aluminum species. Then, the type (i.e., gas, liquid, and solid) of the material source 118 is selected based on the selected species. In one example, if the selected species is gallium, then a Knudsen effusion cell for liquid evaporation of gallium is selected. In some embodiments, the material source may be a cosine N source with a beam flux profile ranging, for example, from about N=1 to about N=6, which is not otherwise possible using conventional MBE. Additional (i.e., multiple) material sources may be included, where the material source and additional material sources are used together; that is, used to deposit different materials onto the substrate at the same time. In some embodiments, the material sources include a nitrogen plasma source that emits active nitrogen, and an oxygen plasma material source.

Each material source 118 has an exit aperture 130 with an exit aperture plane, and a predetermined material ejection spatial distribution from the exit aperture plane. If more than one material source is to be used, a predetermined material ejection spatial distribution for each material source is acquired. In some embodiments, the exit aperture has an exit aperture geometry, and the method further comprises selecting the exit aperture geometry. The predetermined material ejection spatial distribution has a symmetry axis which intersects the substrate at a point offset from the center axis, where the exit aperture is to be positioned at an orthogonal distance, a lateral distance, and a tilt angle relative to the center axis of the substrate. For a cosine N factor material source, the predetermined (e.g., empirically) cosine N factor and material ejection spatial distribution may be acquired from the supplier of the selected material source 118. In one example, the cosine N factor of the selected material source 118 is greater than or equal to 2, such as about 3, or up to about 6.

At a step 718, either i) the VFP tilt angle α at which to install the selected material source 118 is set or ii) the orthogonal distance and the lateral distance for the exit aperture of the material source is set. The VFP tilt angle α of the selected material source 118 may be from about 30° to less than 90° in one example, from about 30° to about 60° in another example, or at about 45° in yet another. In one example, the selected VFP tilt angle α is 45°. The plume 134 of the material source 118 is provided at tilt angles that are unlike conventional MBE in which the plume 134 of the material source 118 is provided substantially orthogonal to the substrate deposition plane 126.

At a step 726, a desired accumulation of the material on the substrate to achieve a desired layer deposition uniformity for a desired growth rate is selected. In some embodiments, the target (desired) uniformity (or non-uniformity) value may be expressed as a flux. In some embodiments, the flux or film uniformity may be expressed as a tolerance value. In one example, the selected target thickness uniformity across the substrate deposition plane 126 is 99% (or equivalently, 1% non-uniformity). In this disclosure, the target value may also be referred to as a desired value. The deposition surface area (i.e., area of the substrate deposition plane 126) is considered in the determination of parameters for the desired layer uniformity and desired growth rate. In one example, the substrate 122 is a 3-inch wafer ($R_{SUB}$=1.5). In another example, the substrate 122 is a 6-inch wafer ($R_{SUB}$=3). In yet another example, the substrate 122 is an 8-inch wafer ($R_{SUB}$=4). In still another example, the substrate 122 is a 12-inch (300 mm) wafer (i.e., $R_{SUB}$=6).

At a step 730, if the tilt angle was set in step 718, then minimum values for the orthogonal distance and the lateral distance to achieve the desired layer deposition uniformity are determined. That is, the shortest distances X and Z for positioning the material source 118 are determined using the plot of the configuration space that corresponds to the selections made in each of the steps 714, 718 and 726. For example, the plot 400 of FIG. 5 shows the configuration space corresponding to a cosine N factor=3 (selected in step 714), a VFP tilt angle α=45° (selected in step 718), and a target non-uniformity=1% (selected in step 726) for an $R_{SUB}$=1.5. The growth rate of the film is improved by determining the shortest distances X and Z that correspond to the selected target uniformity. In some embodiments, the determined orthogonal distance and the determined lateral distance of the material source from the substrate deposition plane is equal to or less than a mean free path of the material emitted from the material source.

At step 730, if the orthogonal distance and the lateral distance were set in step 718, then the tilt angle is determined to achieve the desired layer deposition uniformity using the set orthogonal distance and the set lateral distance.

In some embodiments, additional material sources may be used, and step 730 involves determining either the tilt angle or the orthogonal distance and the lateral distance for when all of the material sources are used together.

In some embodiments, the method of configuring the material deposition system is complete after step 730, for example if the determined orthogonal and vertical distances achieve the desired layer deposition uniformity and growth rate. In an example scenario, a point is selected within the 1% film non-uniformity area of the plot 400 that corresponds to the shortest, or nearly the shortest, possible distances X and Z. In one example, the point A near the apex of the curve 416 of the plot 400 is selected. The point A corresponds to a distance X of about 3.2 and a distance Z of about 2.6. Other points within the 1% film non-uniformity area of the plot 400 may result in longer distances X and Z, thereby yielding slower growth rates. Therefore, by selecting the point A in plot 400, which is near the apex of the curve 416, the shortest, or nearly the shortest, possible distances X and Z are utilized for setting the position of the material source 118 with respect to the substrate deposition plane 126. The growth rate is thereby improved because the closer the material source 118 is to the substrate deposition plane 126, the higher the growth rate will be.

In further embodiments, the determined tilt angle or the determined minimum values of the orthogonal distance and the lateral distance can be tested to see if further optimization is needed. At a step 734, the configuration of the material source 118 with respect to the substrate deposition plane 126 as determined in the steps 714, 718, 726, and 730 is physically implemented and tested to determine whether the target film non-uniformity is achieved in combination with a suitable growth rate to support a high-throughput film formation process. For example and referring to FIG. 2, the material source 118, which has a certain cosine N factor (as determined in the step 714), is positioned at the distances X and Z from the substrate deposition plane 126 that are determined in the step 730 and at the VFP tilt angle α=45° that is selected in the step 718. The vacuum environment 114 of the high-vacuum reaction chamber 100 is pumped to a certain vacuum pressure (e.g., from about $10^{-11}$ torr to about $10^{-7}$ torr), the rotation mechanism of step 710 is used to rotate the substrate 122, and the material source 118 is activated. Periodically, the thickness of the epitaxially grown film is measured at multiple sample points along the substrate deposition plane 126. This measurement may be performed, for example, using a reflection high-energy electron diffraction (RHEED) system that is directed at the substrate deposition plane 126.

At a decision step 738, based on the measurements taken in the step 734, it is determined whether both the desired non-uniformity that is selected in the step 726 and a growth rate suitably high to support a high-throughput film formation process have been achieved. If both the target non-uniformity and growth rate are achieved, the method 700 ends. Any configuration of the material source 118 with respect to the substrate deposition plane 126 is a balance between film quality and film growth rate. Therefore, if the target non-uniformity and growth rate are not achieved, either the desired film quality or the desired film growth rate may be slightly relaxed. In one example, if the target non-uniformity is not achieved, the method 700 may proceed to a step 742.

At the step 742, at least one of the tilt angle, the desired growth rate, the lateral distance, and the orthogonal distance is changed if the testing does not meet the desired layer deposition uniformity. For example, the desired growth rate may be reduced for that particular application (semiconductor product, manufacturing/cost goals). The method 700 then returns to the step 730 in which another point is selected within the desired film non-uniformity area of a certain plot of the configuration space, where the new point corresponds to a slightly greater distance X or Z, or both, and, hence, a slightly reduced growth rate. In another example, the lateral and/or orthogonal distances are adjusted, such as increasing their values if a slower growth rate is acceptable. In a further example, the tilt angle or an exit aperture geometry is changed and another iteration of method 700 is performed, in which the material ejection spatial distribution corresponding to the new tilt angle or exit aperture geometry is used to re-determine the orthogonal distance and the lateral distance.

In some embodiments, the desired layer deposition uniformity of the film may be changed at step 746 if the desired objectives are not being attained. For example, it may be acceptable to reduce the desired uniformity of the film or increase the non-uniformity of the film for a certain application. The method 700 returns to the step 726 in which the uniformity value is reduced (i.e., the non-uniformity value is increased), and then another iteration of the method 700 begins.

In some embodiments, the rotation mechanism and the material source are housed in a reaction chamber, and the method 700 can also include a step 750 of using a relationship of the lateral distance and the orthogonal distance to a radius of the substrate $R_{SUB}$ for scaling a size of the reaction chamber. For example, once minimal distances for positioning the material sources is determined, the reaction chamber size can be scaled down. Reducing the size of the reaction chamber can provide benefits such as decreasing costs of the fabricating the chamber and occupying less space in a manufacturing facility.

The method 700 may also include step 760 of emitting material to form a semiconductor layer. The substrate is heated while the material is emitted onto the substrate. Step 760 can include using the optimal positioning of the material source relative to the substrate, as determined in step 710 through step 738. The tilt angle, the orthogonal distance, and the lateral distance are dynamically adjustable so that the positioning may be adjusted according to which material source(s) are used, which may vary between runs. The tilt angle, the orthogonal distance, and the lateral distance may be dynamically adjustable by adjusting a position of the substrate, or by adjusting the position of the material source.

The VFP tilt angle may be chosen in step 718 with a-priori reference to the type of material source 118 that is chosen. For example, if the material source 118 is a single, open-ended orifice crucible of a liquid effusion source, then its tilt angle is limited by the inclination relative to the vertical direction (if placed in a gravitational field) of the crucible for a given material volume capacity and melt surface position with respect to the exit aperture 130, which is the exit orifice. In general, a well-defined VFP is created at the exit plane defined by the single exit aperture 130 of a cylindrical crucible of body diameter $D_C$ if the melt surface is sufficiently displaced from the exit aperture 130. Furthermore, the VFP at the exit aperture 130 may be characterized by the aperture diameter $D_O$ and aperture depth $L_O$, such that $D_O/L_O<1$ and $D_O<D_C$. Therefore, in practice, liquid sources are suitable when $0°<\alpha<70°$, and more preferably when $30°<\alpha<60°$, and typically when $40°<\alpha<50°$. A standard configuration for a large-capacity material source of this type is $\alpha=45°$. In contrast, a gas-injector material source is not constrained by the internal details of the source and can be used when $0°\leq\alpha<90°$. Clearly, a gas-injector material source type is capable of grazing incidence applications wherein $70°<\alpha<90°$.

In the operation of the high-vacuum reaction chamber 100 in which the position of the material source 118 has been improved with respect to the substrate deposition plane 126 according to the method 700, in one example, the substrate deposition plane 126 (i.e., the substrate 122) is rotating. There is a speed at which species are being ejected from the material source 118 and, therefore, there is an arrival rate of the species at the substrate deposition plane 126. The arrival rate may be expressed, for example, in numbers of atoms or species per unit area per unit time. When the high-vacuum reaction chamber 100 is operating, the rotational speed of the substrate 122 may be, for example, from about 1 rpm to about 1000 rpm. However, the minimum rotational speed of the substrate 122 is determined by the arrival rate of the species per unit time per unit area. That is, there is a correlation between the time it takes for one rotation at the periphery of the substrate 122 and the arrival rate of the species. The accumulation of material is averaged over one rotation of the substrate 122. For a high growth rate that is suitable to support a high throughput system, the rotational speed of the substrate 122 may be, for example, on the order of from about tens of rpm to about hundreds of rpm. While there is a lower limit to the fundamental deposition plane rotation speed relative to the smallest incident arrival rate of species, in general a faster rotation speed may be advantageous.

In summary, the method 700 configures the position of the material source 118 with respect to the substrate deposition plane 126 to epitaxially grow a high-quality film at a growth rate suitable for supporting a continuous, high-throughput film formation process, such as for a continuous, high-throughput semiconductor fabrication process. A distance of the material source 118 from the substrate deposition plane 126 that is suitably short for film growth rates that are suitably high to support a high-throughput film formation process, which is not otherwise possible using conventional MBE; for example, the method may provide at least a 1 Angstrom per second film growth rate improvement over conventional MBE.

Oxide-Based Semiconductor Structures

The above systems, in which material sources are placed at specifically designed locations and angles to achieve highly uniform film layers at high throughput growth rates, may be used to produce oxide-based semiconductor devices. P-type doping of various materials may also be achieved, including p-type doped Mg-based layers. For example, magnesium-based and zinc-based oxides may be formed, including oxide-based layers of $Mg_xZn_{1-x}O$, with x>0, p-type doped $Mg_xZn_{1-x}O$ layers where $0\leq x<0.45$, or a MgZnON layer. In some embodiments, the oxide-based layer is a superlattice comprising sublayers of a) MgO and ZnO, b) MgZnO and ZnO or c) MgZnO and MgO. In some embodiments, the oxide-based layer is a p-type doped layer, and materials are emitted using at least one of: active nitrogen plasma, nitrous oxide ($N_2O$), ammonia ($NH_3$), phosphorus, oxygen plasma, or defective Mg or Zn. In this disclosure, DUV LEDs shall be described; however, other types of semiconductors may be manufactured using the same techniques.

Figure 9:
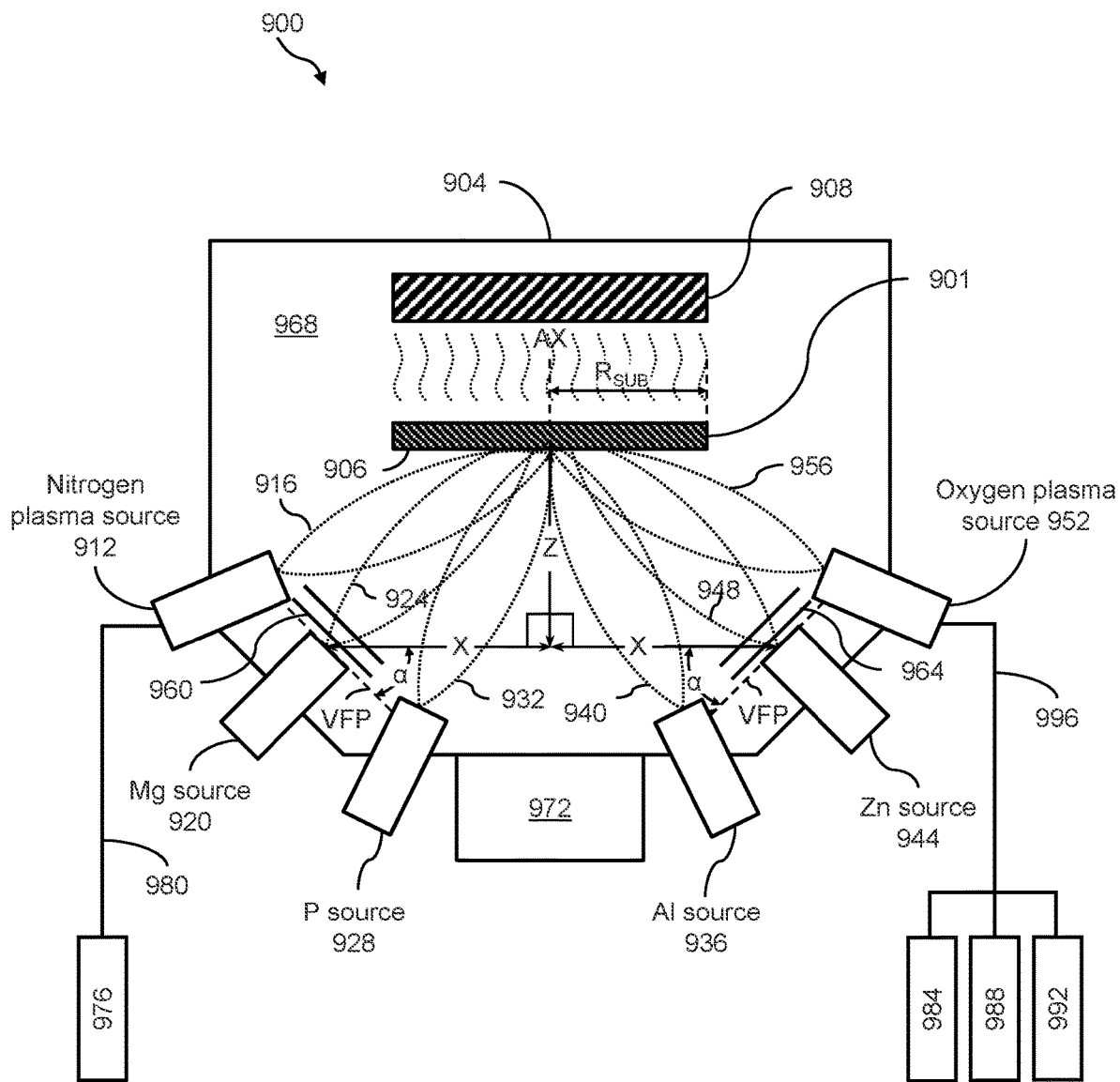
FIG. 9 is a side view of an example of a plasma treatment system used to form semiconductor layers such as high quality, oxide-based films, in accordance with some embodiments.

FIG. 9 is a side view of an example of a plasma treatment system 900 that may be used to form high-quality, oxide-based films on the substrate 901. The plasma treatment system 900 comprises a reaction chamber 904, a heater 908, a nitrogen plasma source 912 that produces nitrogen species 916, an Mg (magnesium) source 920 that produces Mg species 924, a P (phosphorous) source 928 that produces P species 932, an Al (aluminum) source 936 that produces Al species 940, a Zn (zinc) source 944 that produces Zn species 948, and an oxygen plasma source 952 that produces oxygen species 956. The emission of the Mg species 924 is controlled by a shutter 960. The emission of the Zn species 948 is controlled by a shutter 964. The emission of the nitrogen plasma source 912, the P source 928, the Al source 936, and the oxygen plasma source 952 are each similarly controlled by shutters that for the purpose of clarity are not shown in FIG. 9. The plasma treatment system 900 also comprises a vacuum pump 972, which is fluidly coupled to the reaction chamber 904. Positioning mechanisms (not shown) can be coupled to each of the material sources 912, 920, 928, 936, 944 and 952 to adjust the position (lateral distance, orthogonal distance, and tilt angle) of the material source relative to the substrate 901 to meet the desired layer deposition specifications. A positioning mechanism (not shown) may also be coupled to substrate 901 to adjust and move the position of the substrate horizontally (in a direction of the plane of the substrate) or vertically (perpendicular to the plane of the substrate).

The plasma treatment system 900 may also include an optical detector (not shown) and/or a reflection high-energy electron diffraction (RHEED) system (not shown). The plasma treatment system 900 includes a controller (not shown), which may be any computing device, such as a handheld computer, a tablet computer, a laptop computer, a desktop computer, a centralized server, a mobile computing device, and the like.

The substrate 901 is placed in the reaction chamber 904 where it is subjected to a plasma treatment process to create defect-free oxide-based films on the substrate 901. The substrate 901 is rotatable around a center axis of rotation AX. The substrate 901 may be held or manipulated using, for example, a wafer handling system (not shown). The substrate 901 has a certain radius $R_{SUB}$. For example, a 6-inch substrate 901 has a radius $R_{SUB}$ of 3 inches, an 8-inch substrate 901 has a radius $R_{SUB}$ of 4 inches, a 12-inch substrate 901 has a radius $R_{SUB}$ of 6 inches, and so on. The side of the substrate 901 that is facing the material sources is a film formation surface 906. The film formation surface 906 is the surface of the substrate 901 that will be subjected to the plasma treatment process in preparation for subsequent film formation processes. The substrate 901 may also have a backside coating (not shown) for absorbing heat from the heater 908.

Whereas the material sources are located on the film formation surface 906 side of the substrate 901, the heater 908 is located on the opposite side of the substrate 901. The heater 908 is used to heat the substrate 901 and, in turn, the film formation surface 906 of the substrate 901 to a growth temperature $T_g$ suitable for film growth, such as a growth temperature $T_g$ of from about 300° C. to about 700° C. In one example, the heater 908 is a radiative heater with heating elements that are made of rhenium.

The nitrogen plasma source 912 is, for example, an inductively coupled plasma (ICP) source that emits a plasma formed of N* or $N_2$*, shown as the nitrogen species 916. Active nitrogen is an allotrope of nitrogen and is formed by the passage of an electrical discharge through a stream of nitrogen. Unlike the non-active nitrogen used in conventional film formation, which has a very high bond energy that can be dissociated only at temperatures as high as 2,700 kelvins (K), active nitrogen may be dissociated at relatively low temperatures (e.g., 700-800 K). The nitrogen plasma source 912 comprises an excitation apparatus (not shown) and a pressure reducing aperture plate (not shown). Furthermore, one or more mass flow controllers (MFC), shown as an MFC 976, is fluidly coupled to the nitrogen plasma source 912 via a gas line 980. The MFC 976 controls the gas flow rate from a gas source (not shown) containing, for example, $N_2$. In operation, an $N_2$ feedstock gas is supplied via the MFC 976 to the nitrogen plasma source 912 and is then dissociated by energy imparted by the excitation apparatus (not shown) to produce the nitrogen species 916. The nitrogen species 916 enters the deionizer/aperture (not shown), where substantially all the nitrogen species 916 that are in an excited (i.e., ionized) state are neutralized before exiting the deionizer/aperture (not shown). In one example, the beam pressure of the nitrogen species 916 is $10^{-8}$ Torr, which is a beam pressure that is appropriate for doping epitaxial films.

The Mg source 920 is, for example, an effusion cell that emits the Mg species 924, which may be controlled using the shutter 960. In another example, the Mg source 920 produces the Mg species 924 as a precursor gas. Utilizing effusion cells and precursor gases to produce the Mg species 924 reduces the complexity and processing costs associated with the plasma treatment system 900. The Mg species 924 are emitted through sublimation of solid magnesium within the Mg source 920. The flux of the Mg species 924 is expressed as $\Phi(Mg)$. Flux is a measure of the number of atoms per second impinging the substrate surface and is expressed as a beam pressure. In one example, $\Phi(Mg)$ is about $10^{-7}$ Torr.

The P source 928 is an effusion cell that emits the P species 932, which may be controlled using a shutter (not shown). The P species 932 may be elemental phosphorous or an allotrope of phosphorous, for example, diphosphorous ($P_2$) generated by sublimating gallium phosphide (GaP) or cracking tetraphosphorus ($P_4$) using a conventional cracker. The P species 932 serves as a p-type dopant during film formation and contributes to the formation of highly uniform oxide-based films. The flux of the P species 932 is expressed as $\Phi(P)$. In one example, $\Phi(P)$ is about $10^{-7}$ Torr.

The Al source 936 is, for example, an effusion cell that emits the Al species 940, which may be controlled using a shutter (not shown). In another example, the Al source 936 produces the Al species 940 as a precursor gas. Utilizing effusion cells and precursor gases to produce the Al species 940 reduces the complexity and processing costs associated with the plasma treatment system 900. The Al species 940 is, for example, an aluminum monospecies (e.g., pure aluminum). The flux of the Al species 940 is expressed as $\Phi(Al)$. In one example, $\Phi(Al)$ is about $10^{-7}$ Torr. In another embodiment, instead of aluminum species, an indium monospecies or a gallium monospecies is used.

The Zn source 944 is, for example, an effusion cell that emits the Zn species 948, which may be controlled using the shutter 964. In another example, the Zn source 944 produces the Zn species 948 as a precursor gas. Utilizing effusion cells and precursor gases to produce the Zn species 948 reduces the complexity and processing costs associated with the plasma treatment system 900. In the example in which the Zn source 944 is an effusion cell, the Zn species 948 is formed through sublimation of solid zinc within the Zn source 944. The flux of the Zn species 948 is expressed as $\Phi(Zn)$. In one example, $\Phi(Zn)$ is about $10^{-7}$ Torr.

The oxygen plasma source 952 is, for example, an ICP source that emits a plasma formed of one or more gases selected from the group consisting of active atomic oxygen (O*), molecular oxygen ($O_2$*), oxygen-nitrogen (ON), N*, and $N_2^*$. The resulting plasma is shown as the oxygen species 956. In another example, the oxygen source 952 is a source of pure oxygen supplied to the reaction chamber 904. In the example in which the oxygen plasma source 952 is a plasma source, the oxygen plasma source 952 comprises an excitation apparatus (not shown), and a deionizer/aperture (not shown). Furthermore, one or more mass flow controllers (MFC), shown as an MFC 984, an MFC 988, and an MFC 992, are fluidly coupled to the oxygen plasma source 952 via a gas line 996. The MFC 984, the MFC 988, and the MFC 992 control gas flow rates from gas sources (not shown) containing, for example, $N_2$, $O_2$, or $N_2O$. In one example of operation, $N_2$ and $O_2$ are combined in a fixed proportion and supplied to the oxygen plasma source 952 and are then in their combined form dissociated by energy imparted by the excitation apparatus (not shown) to produce oxygen species 956. The oxygen species 956 enters the deionizer/aperture (not shown), where substantially all the oxygen species 956 that are in an excited (i.e., ionized) state are neutralized before exiting the deionizer/aperture (not shown). In one example, 99% of $O_2$ is mixed with 1% of $N_2$ to produce a plasma of the oxygen species 956, which then produces a p-type doped film on the film formation surface 906. The oxygen species 956 enhances the operating efficiency of the plasma treatment system 900 by reducing the required processing temperature levels and operating costs of the plasma treatment system 900. In some embodiments, p-type doping of oxides (i.e., forming a p-type oxide layer) is uniquely achieved by i) replacing (i.e., substituting) some oxygen atoms in the semiconductor crystal structure with nitrogen (e.g., 1 oxygen atom in every 1000), ii) replacing (i.e., substituting) some Mg or Zn atoms in the crystal structure with Al or Ga (e.g., 1 Mg or Zn atom in every 10), or both (i) and (ii).

Film deposition of oxide-based films in the plasma treatment system 900 occurs at from about 500° C. to about 700° C. in one example, and at about 600° C. in another example. With the oxygen plasma source 952 in place to enhance system efficiency, film growth in the plasma treatment system 900 may occur at temperatures as low as 350° C. By contrast, conventional film deposition temperatures for group III-N materials range from about 900° C. to about 1,200° C., and growth temperature tolerances must be controlled to within 5° C. The lower deposition temperatures supported by the plasma treatment system 900 of the present embodiments enables (1) less complex and less costly processing equipment, (2) lower process energy usage, and (3) larger growth temperature tolerances than in conventional systems. Lower growth temperatures and larger growth temperature tolerances facilitate high-quality film growth on larger substrates and, thus, higher production throughput.

A vacuum environment 968 is maintained within the reaction chamber 904 by the vacuum pump 972. The vacuum pump 972 may be a conventional variable-speed vacuum pump that can evacuate the reaction chamber 904 at a certain rate known as the pumping speed. A valve (not shown) may be associated with the vacuum pump 972. A pressure sensor (not shown) may be provided for monitoring the vacuum pressure inside the reaction chamber 904. The vacuum pump 972 is used to maintain adequate vacuum pressure within the reaction chamber 904. The vacuum pressure within the reaction chamber 904 during film formation is, for example, from about $10^{-11}$ Torr to about $10^{-5}$ Torr.

In another embodiment of the plasma treatment system 900, pure oxygen ($O_2$) is supplied to the reaction chamber 904 through a heated pipe (not shown) rather than the oxygen plasma source 952. The temperature of the oxygen entering the reaction chamber 904 is, for example, from about 200° C. to about 300° C. In one example, the heated pipe (not shown) is formed of sapphire.

The film formation surface 906 of the substrate 901 is the target of the material delivered from the nitrogen plasma source 912, the Mg source 920, the P source 928, the Al source 936, the Zn source 944, and the oxygen plasma source 952. The shutter 960 is positioned in the path of the Mg species 924 emitted from the Mg source 920. When open, the shutter 960 allows the Mg species 924 to impinge the film formation surface 906 of the substrate 901. When closed, the shutter 960 prevents the Mg species 924 from impinging the film formation surface 906 of the substrate 901. The shutter 964 is positioned in the path of the Zn species 948 emitted from the Zn source 944. When open, the shutter 964 allows the Zn species 948 to impinge the film formation surface 906 of the substrate 901. When closed, the shutter 964 prevents the Zn species 948 from impinging the film formation surface 906 of the substrate 901. Other shutters (not shown) similarly control the impingement of the nitrogen species 916, the P species 932, the Al species 940, and the oxygen species 956 upon the film formation surface 906 of the substrate 901.

When the reaction chamber 904 is at the desired film growth temperature $T_g$ and vacuum pressure, the nitrogen plasma source 912, the Mg source 920, the P source 928, the Al source 936, the Zn source 944, and the oxygen plasma source 952 are turned on. The combined impingement of the nitrogen species 916, the Mg species 924, the P species 932, the Al species 940, the Zn species 948, and the oxygen species 956 upon the film formation surface 906 of the substrate 901 forms oxide-based layers on the film formation surface 906.

FIG. 9 shows that the Mg source 920 and the Zn source 944 are located a certain lateral distance X from the center axis of rotation AX of the substrate 901 and a certain vertical distance Z from the plane of the film formation surface 906. This positioning is shown for example purposes. The lateral distance X and the vertical distance Z are the coordinates of the Mg source 920 and the Zn source 944 with respect to the center of the film formation surface 906. Further, the Mg source 920 and the Zn source 944 are positioned at a virtual flux plane (VFP) tilt angle α with respect to the plane of the film formation surface 906. The nitrogen plasma source 912, the P source 928, the Al source 936, and the oxygen plasma source 952 are each similarly positioned at a lateral distance X from the center axis of rotation AX of the substrate 901 and a vertical distance Z from the plane of the film formation surface 906. Hence, the Mg source 920, the Zn source 944, the nitrogen plasma source 912, the P source 928, the Al source 936, and the oxygen plasma source 952 are "off-axis" material sources.

Figure 10A:
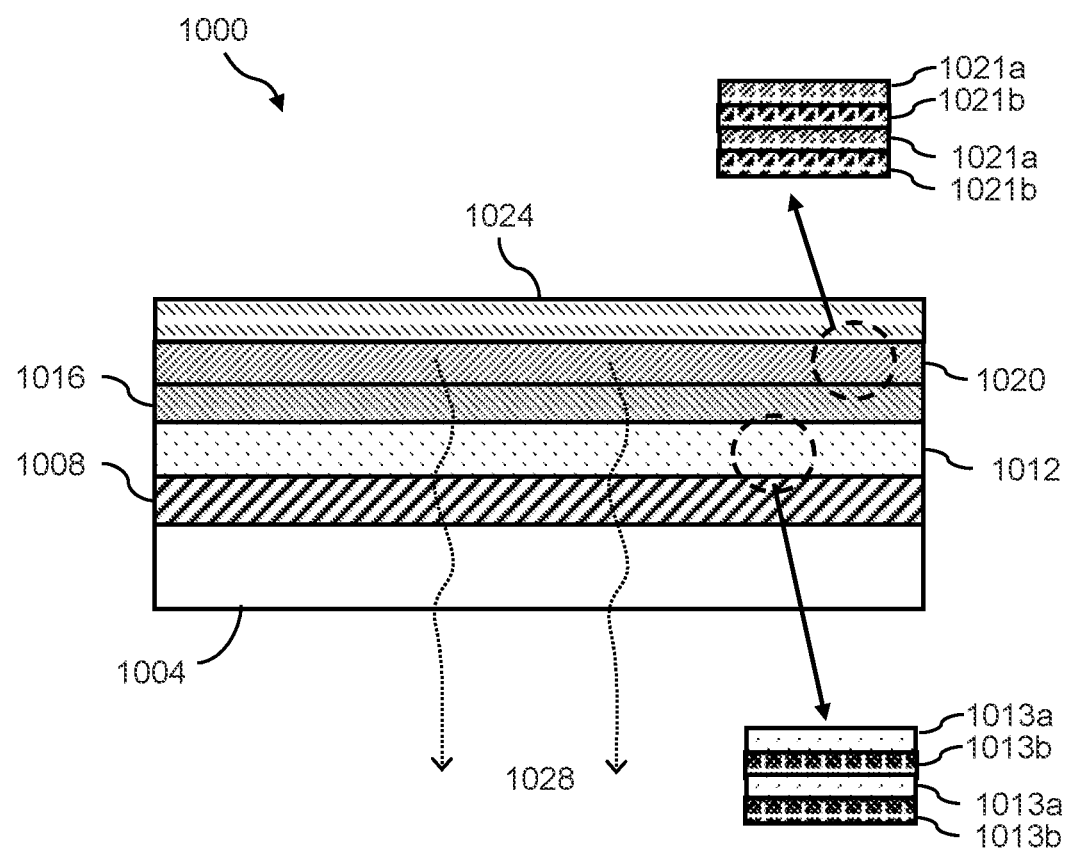
FIGS. 10A-10B are cross-sectional views of oxide-based LED device structures, in accordance with some embodiments.

FIG. 10A is a cross-sectional view of an example of an LED device structure 1000, which is an example of an oxide-based structure to be manufactured according to some embodiments. The LED device structure 1000 is useful for forming, for example, a DUV LED. The DUV LED may operate in the UVC wavelength range of about 100 nm to about 280 nm. The LED device structure 1000 may be used to form a single completed device or may be used to form multiple devices as part of a high-volume, high-throughput production process. The LED device structure 1000 comprises a substrate 1004, upon which a plurality of oxide-based layers is deposited. Specifically, the LED device structure 1000 comprises the substrate 1004 on which are deposited, in order, an MgZnO buffer layer 1008, an MgO—MgZnO multilayer 1012, an n-type MgZnO layer 1016, an NID layer 1020, and a p-type MgZnO layer 1024.

The LED device structure 1000 is an example of a lateral PIN diode. The NID layer 1020 serves as an intrinsic heterojunction between the n-type MgZnO layer 1016 and the p-type MgZnO layer 1024. A heterojunction is defined as the interface between two layers of dissimilar crystalline semiconductors that feature unequal bandgaps.

In one example, the substrate 1004 is formed of sapphire, calcium chloride, or magnesium oxide, which is substantially transparent to light (e.g., light 1028). In this example, the thickness of the substrate 1004 is from about 500 µm to about 1,000 µm; further, the diameter of the substrate 1004 is from about 4 inches to about 12 inches. In another example, the substrate 1004 is formed of silicon carbide, silicon or gallium nitride (GaN), which absorbs light and therefore is not transparent to the light 1028.

The MgZnO buffer layer 1008 is formed of MgZnO and has a thickness of, for example, from about 200 nm to about 1 µm. The MgZnO buffer layer 1008 serves to minimize threading dislocations and thus reduce the defect density in films formed atop the MgZnO buffer layer 1008.

The MgO—MgZnO multilayer 1012 is a superlattice layer formed of a plurality of alternating MgO sub-layers 1013a and MgZnO sub-layers 1013b, where two of each sub-layer 1013a and 1013b are illustrated for simplicity but may contain more sub-layers. The MgO—MgZnO multilayer 1012 serves to further minimize threading dislocations and thus reduce the defect density in films formed atop the MgO—MgZnO multilayer 1012.

The n-type MgZnO layer 1016 is formed of MgZnO and is n-type doped with, for example, aluminum, gallium, or indium. Aluminum, for example, is a group III metal with the desirable property of being highly evaporable. The n-type MgZnO layer 1016 has a thickness of, for example, from about 200 nm to about 1 µm.

The NID layer 1020 is a superlattice layer of alternating sub-layers 1021a and 1021b where two of each sub-layer 1021a and 1021b are illustrated for simplicity but may contain more sub-layers. Some sub-layers may be formed of, for example, intrinsic MgZnO or MgO. Additionally, the NID layer 1020 may contain one or more quantum-well structures formed of a narrow bandgap material. In one example, the NID layer 1020 is formed primarily of MgO (i.e., the barrier material) for sub-layer 1021a, and contains one or more narrow bandgap ZnO quantum-well sub-layers 1021b. The NID layer 1020 has a thickness of, for example, from about 10 nm to about 50 nm. In another example, the NID layer 1020 is formed as a superlattice structure using a MgZnO or MgZnO—ZnO alloy.

The p-type MgZnO layer 1024 is formed of, for example, nitrogen-doped MgZnO and has a minimum thickness of, for example, about 200 nm. P-type doping of the p-type MgZnO layer 1024 is achieved using, for example, a plasma of N* or $N_2$* according to the method described below in reference to FIG. 11. In another example, p-type doping of the p-type MgZnO layer 1024 is achieved using independent sources of nitrous oxide ($N_2O$) or ammonia ($NH_3$). The p-type MgZnO layer 1024 provides the ability to tune the bandgap of the device across a broad wavelength range, whereas conventional group III-N films are limited in their bandgap-tuning ability. For example, it is extremely difficult to create a UV LED operating at 190 nm (i.e., 6 eV) or below using AlN alone. In some cases, boron-AlN compounds may be used. However, this material entails high levels of nitrogen and high deposition temperatures, both of which may be extremely costly, technically infeasible, and/or commercially infeasible. Moreover, it is quite problematic to dope boron-AlN compounds to an electrical conductivity type. In contrast, p-type MgZnO films can be produced at easily achieved deposition temperatures and can be doped to p-type conductivity with easily achieved levels of nitrogen.

Following the formation of the p-type MgZnO layer 1024, electrical contacts (e.g., anodes and cathodes; not shown) are formed using standard metallization and lithographic processing. The electrical contacts are formed of, for example, nickel (Ni), palladium (Pd), titanium (Ti), aluminum (Al), titanium nitride (TiN), or titanium aluminum (TiAl).

In one example, the epitaxial layers of the LED device structure 1000 are deposited such that the charge carriers (i.e., electrons and holes) move vertically and light (i.e., photons), shown as light 1028 in FIG. 10A, is also emitted vertically. In another example, the epitaxial layers of the LED device structure 1000 are deposited such that the charge carriers move laterally, and light is also emitted laterally. "Laterally" in FIG. 10A refers to the direction substantially along the plane of the layer growth, while "vertically" refers to the direction substantially perpendicular or normal to the plane of the layer growth.

In operation, the n-type MgZnO layer 1016 produces electrons that move vertically into the NID layer 1020. Continuing the example, the p-type MgZnO layer 1024 emits holes that move vertically into the NID layer 1020. The charge carriers interact and recombine within the NID layer 1020 and are emitted as light 1028 from the LED device structure 1000. In the example in which the LED device structure 1000 is a UVC LED, the NID layer 1020 is designed to emit light in the wavelength range of from about 100 nm to about 280 nm. In the example in which the substrate 1004 is substantially transparent to light, a certain percentage of the light emitted from the NID layer 1020 is emitted directly through the substrate 1004.

Figure 10B:
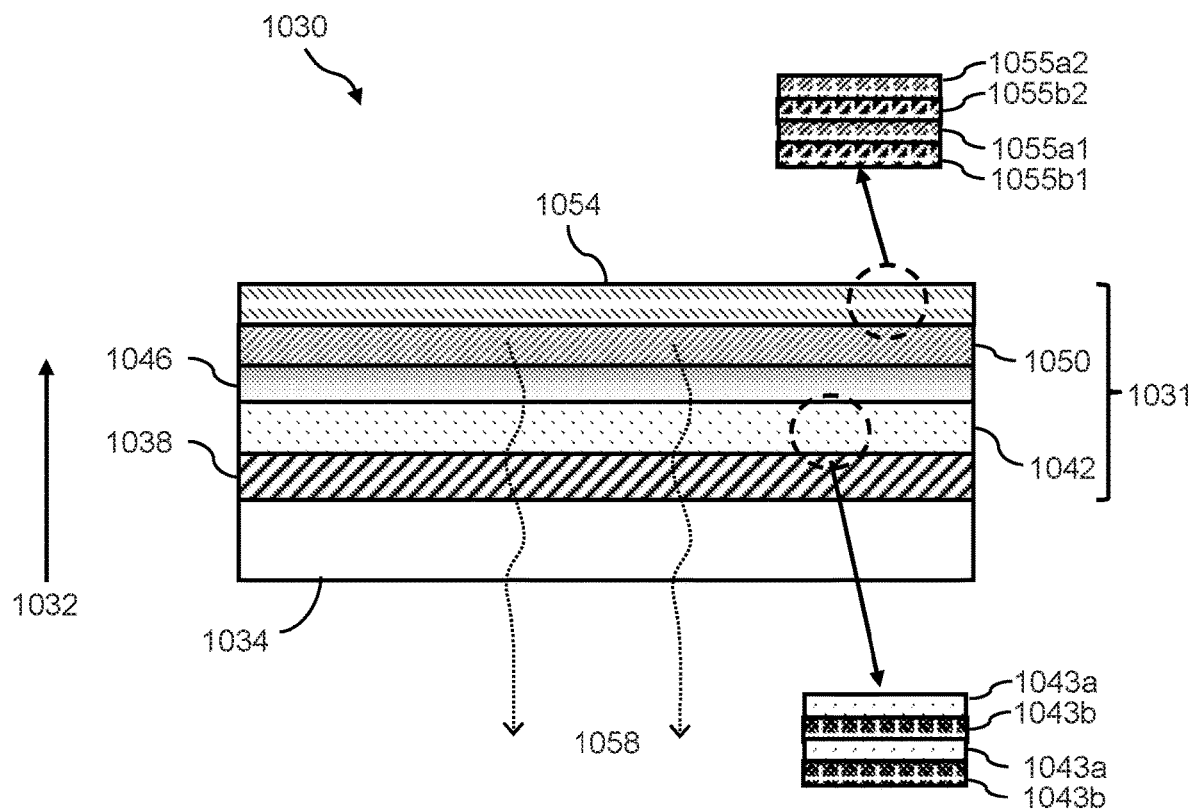

FIG. 10B is a cross-sectional view of an optoelectronic device embodied as an LED device structure 1030, in which a multi-region stack 1031 comprises a crystal polarity that has either an oxygen-polar crystal structure or metal polar crystal structure along a growth direction 1032. The growth direction 1032 is vertical in FIG. 10B, relative to the horizontal plane of the layers of the multi-region stack 1031. The LED device structure 1030 is useful for forming, for example, a DUV LED. The DUV LED may operate in the UVC wavelength range of about 100 nm to about 280 nm. The LED device structure 1030 may be used to form a single completed device or may be used to form multiple devices as part of a high-volume, high-throughput production process. The LED device structure 1030 has a substrate 1034, upon which the crystal polar multi-region stack 1031 of at least five regions is epitaxially deposited. The multi-region stack 1031 includes regions (i.e., layers) 1038, 1042, 1046, 1050 and 1054.

In one embodiment, the substrate 1034 is formed of sapphire, calcium chloride, or magnesium oxide, which is substantially transparent to light (e.g., light 1058). In this example, the thickness of the substrate 1034 may be from about 500 µm to about 1,000 µm. The diameter of the substrate 1034 may be from about 4 inches to about 12 inches. In another example, the substrate 1034 is formed of silicon carbide, silicon or gallium nitride (GaN), which absorbs light and therefore is not transparent to the light 1058.

A first region 1038 of the multi-region stack 1031 is a buffer layer that is formed on a surface of the substrate 1034. First region 1038 serves to improve the atomic surface quality of the substrate 1034 by minimizing threading dislocations and thus reducing the defect density in films formed atop the first region 1038. A second region 1042 on buffer layer 1038 serves as a crystal structure improvement layer. The second region 1042 further minimizes threading dislocations and thus reduces the defect density in films formed atop the second region 1042.

A third region 1046 on second region 1042 has a first conductivity type, such as n-type or p-type conductivity. A fifth region 1054 has a second conductivity type, with a fourth region 1050 being an intrinsic conductivity type (NID) layer in between third region 1046 and fifth region 1054. The second conductivity type is opposite the first conductivity type. For example, if third region 1046 is n-type, then fifth region 1054 is p-type. Conversely, if third region 1046 is p-type, then fifth region 1054 is n-type.

The multi-region stack 1031 includes at least one region (i.e., layer) that is a bulk semiconductor material comprising $Mg_{(x)}Zn_{(1-x)}O$ and at least one region that is a superlattice, where the superlattice comprises at least two compositions selected from ZnO, MgO and $Mg_{(x)}Zn_{(1-x)}O$. In one embodiment, the buffer layer (first region 1038) may be made of MgZnO with a thickness of, for example, from about 200 nm to about 1 μm. In one embodiment, the second region 1042 is a superlattice layer formed of a plurality of alternating MgO sub-layers 1043a and MgZnO sub-layers 1043b, where two of each sub-layer 1043a and 1043b are illustrated for clarity but may contain more sub-layers.

In some embodiments, at least one of the third region 1046 or the fifth region 1054 (the n-type or p-type conductivity layers) is formed by introducing at least one of silicon, germanium, nitrogen, aluminum, gallium, nickel, or phosphorous into the oxygen-polar or a metal-polar crystal structure of the multi-region stack 1031. In some embodiments, at least one of the third region 1046 or the fifth region 1054 is formed using compositional grading of a bulk or bulk-like composition of the form of $Mg_{(x)}Zn_{(1-x)}O$. X is a spatially dependent value that varies along the growth direction. That is, the third region 1046 or the fifth region 1054 may be comprised of a spatially dependent composition of $Mg_{(x)}Zn_{(1-x)}O$ that changes along the oxygen-polar or metal-polar (vertical in FIG. 10B) growth direction 1032. An example of compositional grading is represented by the gradient shading in third region 1046 in FIG. 10B.

In some embodiments, at least one of the third region 1046 or the fifth region 1054 (the n-type or p-type conductivity layers) is formed using compositional grading of an effective alloy composition of a superlattice. The superlattice has a plurality of bilayer pairs formed of alternating layers of $Mg_{(x)}Zn_{(1-x)}O$ and $Mg_{(y)}Zn_{(1-y)}O$, where x≠y. The effective alloy composition of the superlattice varies spatially along the growth direction. That is, the spatially dependent effective alloy of the superlattice, as determined by x and y, varies along the oxygen-polar or metal-polar growth direction 1032. An example of a compositional grading of a superlattice is represented by fifth region 1054 in FIG. 10B, in which sub-layers 1055a1 and 1055a2 may be $Mg_{(x)}Zn_{(1-x)}O$ and sub-layers 1055b1 and 1055b2 may be $Mg_{(y)}Zn_{(1-y)}O$. The alternating sub-layers of $Mg_{(x)}Zn_{(1-x)}O$ and $Mg_{(y)}Zn_{(1-y)}O$ form bilayers. For sub-layers 1055a1 and 1055a2, x changes along the growth direction 1032. Similarly, for sub-layers 1055b1 and 1055b2, y changes along the growth direction 1032.

In other embodiments, FIG. 10B may also represent optoelectronic devices, such as LEDs, having non-polar crystalline material structures. In such embodiments, the multi-region stack 1031 comprises a non-polar crystalline material structure along the growth direction 1032. Similar to the polar crystal structure described above, the multi-region stack 1031 for a non-polar crystalline structure includes regions (i.e., layers) 1038, 1042, 1046, 1050 and 1054. First region 1038 of the multi-region stack 1031 is a buffer layer that is formed on a surface of the substrate 1034. Second region 1042 on buffer layer 1038 serves as a crystal structure improvement layer. Third region 1046 on second region 1042 has a first conductivity type, such as n-type or p-type conductivity. Fourth region 1050 is an intrinsic conductivity type (NID) layer. Fifth region 1054 has a second conductivity type opposite the first conductivity type. At least one region of the multi-region stack 1031 is a bulk or bulk-like semiconductor material comprising $Mg_{(x)}Zn_{(1-x)}O$. At least one region of the multi-region stack 1031 is a superlattice, where the superlattice comprises at least two compositions selected from ZnO, MgO and $Mg_{(x)}Zn_{(1-x)}O$.

In some embodiments of a non-polar crystalline structure of FIG. 10B, at least one of the third region 1046 or the fifth region 1054 is formed by introducing at least one of silicon, germanium, nitrogen, aluminum, gallium, nickel or phosphorous into the non-polar crystalline material structure. In some embodiments, at least one of the third region 1046 or the fifth region 1054 (n-type or p-type conductivity regions) is formed using compositional grading of an elective alloy composition of a superlattice, where the superlattice has a plurality of bilayer pairs formed of $Mg_{(x)}Zn_{(1-x)}O/Mg_{(y)}Zn_{(1-y)}O$, in which x≠y and M is selected from Zn, Al, Ga, Ni, N, and P. The effective alloy composition of the superlattice varies along the growth direction (i.e., x and y are spatially dependent in the growth direction). For example, for fifth region 1054, sub-layers 1055a1 and 1055a2 may be $Mg_{(x)}Zn_{(1-x)}O$ while sub-layers 1055b1 and 1055b2 may be $Mg_{(y)}Zn_{(1-y)}O$. In some embodiments, the multi-region stack 1031 consists of (i.e., all the compositions of the multi-region stack 1031 are selected from) $Mg_{(x)}Zn_{(1-x)}O$ compositions, where $0.55 < x \leq 1.0$, and M is selected from Zn, Al, Ga, Ni, N, and P.

Figure 11:
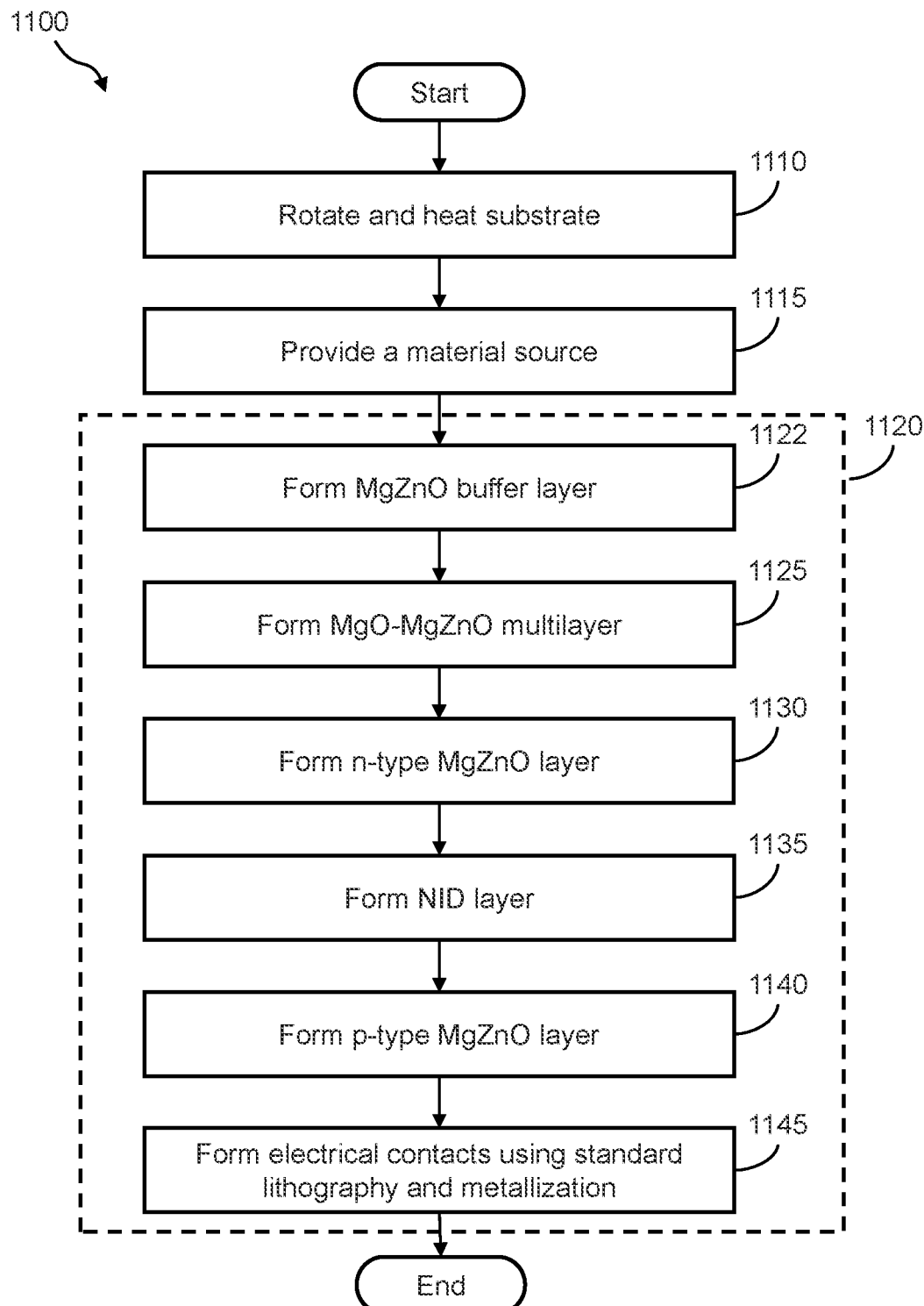
FIG. 11 is a flow diagram of an example of a method of forming the LED device structures shown in FIGS. 10A-10B, in accordance with some embodiments.

FIG. 11 is a flow diagram of an example of a method 1100 for forming high-quality, oxide-based LED device structures using, for example, the plasma treatment system 900 of FIG. 9. The method 1100 comprises the steps below which shall be described using the device structure 1000 of FIG. 10A but may also apply to the device structures of FIG. 10B and other oxide devices.

Step 1110 involves rotating a substrate around a center axis of a substrate deposition plane of the substrate and heating the substrate. The substrate is loaded in a reaction chamber in preparation for producing a high-quality, oxide-based LED. The substrate is formed of, for example, calcium fluoride, MgO (111) and (001) surface orientations, $Ga_2O_3$ (−201) and (010) surface orientations, $Al_2O_3$ (c-plane and r-plane), Si (111), Si (001), rare-earth oxide buffer layers, or MgZnO superlattice buffer layers. Using a vacuum pump, the vacuum pressure inside the reaction chamber is pumped down to about $10^{-5}$ Torr or less to evacuate the chamber such that the substrate is contained within a vacuum environment. Further, a heater is activated to provide a desired growth temperature $T_g$ at a film formation surface of the substrate.

Step 1115 includes providing at least one material source that supplies a material to the substrate. The material source is contained within the vacuum environment of the reaction chamber. Each material source has i) an exit aperture with an exit aperture plane and ii) a predetermined material ejection spatial distribution from the exit aperture plane. The predetermined material ejection spatial distribution has a symmetry axis which intersects the substrate at a point offset from the center axis. The exit aperture is positioned at an orthogonal distance, a lateral distance, and a tilt angle relative to the center axis of the substrate. All material sources in the plasma reaction chamber are activated while the shutters remain closed. The material sources may include, for example, one or more of a nitrogen plasma source, a Mg source, a P source, an Al source, a Zn source, a nitrous oxide ($N_2O$) source, an ammonia ($NH_3$) source and an oxygen plasma source which are activated while their associated shutters remain closed so that no species impinge the film formation surface of the substrate.

Step 1120 involves emitting material from the material sources to form semiconductor layers on the substrate, such as oxide-based layers and p-type doped layers. Step 1120 may include steps 1122, 1125, 1130, 1135, 1140 and 1145 for forming individual layers of the semiconductor device. During the emitting of step 1120, the exit aperture for at least one of the material sources is positioned such that either i) the orthogonal distance and the lateral distance are minimized for a set tilt angle, to achieve a desired layer deposition uniformity for a desired layer growth rate of the semiconductor layer on the substrate, or ii) the tilt angle is determined for a set orthogonal distance and a set lateral distance, to achieve the desired layer deposition uniformity for the desired layer growth rate of the semiconductor layer on the substrate.

The layers of device structure 1000 of FIG. 10A shall now be used to describe the steps of FIG. 11; however, other layers may be formed using the methods and systems disclosed herein. At step 1122, the MgZnO buffer layer (e.g., layer 1008) is formed to a desired thickness. Namely, the shutters associated with the oxygen plasma source, Mg species (e.g., shutter 960) and Zn species (e.g., shutter 964) are opened, and thereby the oxygen species impinges the film formation surface of the substrate. In one example, the thickness of the MgZnO buffer layer formed is about 200 nm. During film growth, the vacuum pressure inside the reaction chamber is maintained via the vacuum pump at about $10^{-5}$ Torr or less to ensure ballistic transport of the Mg species, the Zn species, and the oxygen species to the film formation surface of the substrate.

At step 1125, the MgO—MgZnO multilayer (e.g., layer 1012) is formed to a desired thickness. Namely, the shutters associated with the oxygen plasma source, Mg species and Zn species are opened, and thereby the oxygen species impinges the film formation surface of the substrate to form the MgZnO component (sub-layer) of the MgO—MgZnO multilayer. The shutter for the Zn species (e.g., shutter 964) is then closed to form the MgO component (sub-layer) of the MgO—MgZnO multilayer. The Zn shutter is alternately opened and closed during formation of the multiple respective sub-layers of the superlattice MgO—MgZnO multilayer until a desired layer thickness is achieved.

At step 1130, the n-type MgZnO layer (e.g., layer 1016) is formed to a desired thickness. Namely, the shutters associated with the oxygen plasma source, Mg species and Zn species are opened, and thereby the oxygen species impinges the film formation surface of the substrate to form the MgZnO component of the n-type MgZnO layer. Simultaneously, the shutter that controls the Al source is opened and the Al species impinges the film formation surface of the substrate to serve as an n-type dopant in the n-type MgZnO layer.

At step 1135, the NID layer (e.g., layer 1020) is formed to a desired thickness. In the example in which the NID layer contains one or more quantum-well structures formed of narrow bandgap zinc-oxide (ZnO) quantum-well sub-layers, the MgO barrier material is formed by opening the Mg shutter (e.g., shutter 260) and the shutter associated with the oxygen plasma source to allow the Mg species and the oxygen species to impinge the film formation surface of the substrate. The ZnO quantum-well sub-layers are formed by simultaneously closing the Mg shutter and opening the Zn shutter (e.g., shutter 264) to allow the Zn species to impinge the film formation surface of the substrate. The Mg and Zn shutters are alternately opened and closed during the formation of the multiple respective sub-layers of the NID layer until a desired layer thickness is achieved. In one example, the thickness of the NID layer is about 25 nm.

At step 1140, the p-type MgZnO layer (e.g., layer 1024) is formed to a desired thickness. Namely, the shutters associated with the oxygen plasma source, Mg species and Zn species are opened, and thereby the oxygen species impinges the film formation surface of the substrate to form the MgZnO component of the p-type MgZnO layer. Simultaneously, the shutter associated with the nitrogen plasma source is opened and thereby the nitrogen species impinge the film formation surface of the substrate. The nitrogen species are, for example, $N^*$ or $N_2^*$ and serve as a p-type dopant in the p-type MgZnO layer. A beam flux monitor, such as a RHEED system, may be used to monitor the flux of the nitrogen species.

At step 1145, electrical contacts are formed on the LED device structure (e.g., device 1000) using a conventional lithographic and metallization process. The LED device structure is a vertical conduction LED in which charge carriers interact and recombine within the NID layer to generate the light emitted from the LED device structure. In another example, the method 1100 is used to form a lateral conduction LED in which light emission occurs laterally.

In summary, the plasma treatment systems and the methods of forming high-quality, oxide-based devices (e.g. DUV LEDs) exhibit advantages over conventional systems for and methods of forming group III-N films using epitaxial growth. Conventional semiconductor manufacturing equipment and epitaxial processes are unable to maintain the film growth temperature tolerances and precursor gas levels necessary for high-quality film deposition, especially for substrates larger than 4 inches in diameter. This limitation may result in non-uniform temperature profiles across the film formation surface and therefore yield low-quality or unusable devices. Finally, conventional group III-N films are limited in their device bandgap tuning ability. This limits flexibility in semiconductor device design and application, particularly in the manufacturing of DUV LEDs. In contrast, the present plasma treatment systems and methods disclosed herein emphasize the production of high-quality films on larger substrates, greater device application flexibility, higher production throughput, and reduced manufacturing costs.

The present methods and systems may be used in general to form structures having one or more MgZnO layers, thus providing metal-rich and/or oxygen-rich compositions. These are classed as non-stoichiometric materials and exhibit oxygen and/or metal vacancies which can be engineered to exhibit excess electrons or holes depending on the crystallographic defect introduced in the crystal. In some embodiments, the structures are $Mg_yZn_{1-y}O/Mg_xZn_{1-x}O$ superlattices or MgZn(O,N) oxynitride compositions. For example, the semiconductor layers may be a superlattice comprising sublayers of a) MgO and ZnO, b) MgZnO and ZnO or c) MgZnO and MgO.

Examples of MgZnO structures that are grown according to the present embodiments include MgO as a layer and substrate; an $Mg_xZn_{1-x}O$ layer, with x>0.5 (rocksalt); and $MgO/Mg_xZn_{1-x}O$, x>0.55 (non-polar rocksalt). In some embodiments, polar structures comprising wurtzitic $Mg_xZn_{1-x}O$, x<0.45 may be fabricated, such as superlattices of $Mg_xZn_{1-x}O$, where $0 \leq x < 0.45$; superlattices of $[Mg_xZn_{1-x}O, 0 \leq x < 0.45]/[Mg_yZn_{1-y}O, 0 \leq y < 0.45]$, where $x \neq y$; and graded compositions of bulk $Mg_xZn_{1-x}O$, $0 \leq x < 0.45$. The graded compositions of bulk $Mg_xZn_{1-x}O$ can include p- or n-type doping that is induced. For example, some methods can induce p-type by grading WBG to NBG for O-polar on substantially C-plane oriented, or by grading NBG to WBG for metal-polar on substantially C-plane oriented. In other examples, methods can induce n-type by grading WBG to NBG for metal-polar on substantially C-plane oriented, or by grading NBG to WBG for O-polar on substantially C-plane oriented. In some embodiments, a graded effective alloy composition can be created by grading a superlattice unit cell using the bulk criteria described for bulk $Mg_xZn_{1-x}O$.

In addition to the polarization-type doping as described in the previous paragraph, impurity type doping may also be used. In some embodiments, both impurity and polarization type doping can be used.

Other embodiments include forming a device using polarization doping of MgZnO for compositions x<0.45. Yet other embodiments include forming a mixed type superlattice comprising MgO/ZnO, or comprising a superlattice of $[Mg_xZn_{1-x}O, 0 \leq x \leq 1]/[Mg_yZn_{1-y}O, 0 \leq y \leq 1]$, where $x \neq y$. Yet further embodiments include forming non-polar $Mg_xZn_{1-x}O$ structures, where x>0.55.

The structures may be grown on various substrates, such as: MgO (111) and (001) surface orientations, $Ga_2O_3$ (-201) and (010) surface orientations, $Al_2O_3$ (c-plane and r-plane), Si (111) for use with wurtzitic MgZnO x<0.45, Si (001) for use with MgZnO x>0.55, rare-earth oxide buffer layers, and MgZnO superlattice buffer layers.

MgZnO superlattices and multiple quantum wells (MQWs) enable thicker layers for quantization effects, and are easier to grow than AlGaN or AlN/GaN superlattices.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A material deposition system comprising:
a rotation mechanism that rotates a substrate deposition plane of a substrate around a center axis of the substrate deposition plane;
a heater configured to heat the substrate;
a material source that supplies a material to the substrate, wherein the material source has i) an exit aperture with an exit aperture plane and ii) a predetermined material ejection spatial distribution from the exit aperture plane, the predetermined material ejection spatial distribution having a symmetry axis which intersects the substrate at a point offset from the center axis, wherein the exit aperture is positioned at an orthogonal distance, a lateral distance, and a tilt angle relative to the center axis of the substrate; and
a positioning mechanism that allows dynamic adjusting of the orthogonal distance, the lateral distance, or the tilt angle;
wherein the positioning mechanism allows the dynamic adjusting to occur between production runs, and wherein the orthogonal distance, the lateral distance, or the tilt angle depends on the predetermined material ejection spatial distribution of the material source being used.

2. The system of claim 1, wherein the exit aperture is positioned such that the orthogonal distance and the lateral distance are minimized to achieve a desired layer deposition uniformity for a desired layer growth rate.

3. The system of claim 1, further comprising a reaction chamber in which the rotation mechanism and the material source are housed; and
wherein a size of the reaction chamber is scaled based on a relationship of the lateral distance and the orthogonal distance to a radius $R_{SUB}$ of the substrate.

4. The system of claim 3, wherein the size of the reaction chamber is scaled down based on minimal distances for positioning the material source, the minimal distances being the lateral distance and the orthogonal distance.

5. The system of claim 1, wherein the positioning mechanism is coupled to the material source.

6. The system of claim 1, wherein the positioning mechanism is coupled to the rotation mechanism.

7. The system of claim 1, wherein the material source is a cosine N source and $N \geq 2$.

8. The system of claim 1, wherein the substrate has a diameter equal to or greater than 6 inches (150 mm).

9. The system of claim 1, wherein:
the material source is a nitrogen plasma source that emits active nitrogen; and
the system further comprises an oxygen plasma source.

10. The system of claim 1, further comprising additional material sources including one or more sources of Mg, P, Al, Zn or Ga.

11. The system of claim 1, wherein the substrate and the material source are contained in a vacuum environment of $10^{-11}$ torr to $10^{-5}$ torr, the vacuum environment having a growth pressure during film formation that is higher than a base pressure; and
wherein the orthogonal distance and the lateral distance of the material source from the substrate deposition plane is equal to or less than a mean free path of the material emitted from the material source.

12. The system of claim 1, wherein:
the material source is a cosine N source and $N \geq 2$;
the substrate has a diameter equal to or greater than 6 inches (150 mm);

the substrate and the material source are contained in a vacuum environment of $10^{-11}$ torr to $10^{-5}$ torr; and the orthogonal distance and the lateral distance of the material source from the substrate deposition plane is equal to or less than a mean free path of the material emitted from the material source.

13. A material deposition system comprising:

a rotation mechanism that rotates a substrate deposition plane of a substrate around a center axis of the substrate deposition plane;

a heater configured to heat the substrate;

a material source that supplies a material to the substrate, wherein the material source has i) an exit aperture with an exit aperture plane and ii) a predetermined material ejection spatial distribution from the exit aperture plane, the predetermined material ejection spatial distribution having a symmetry axis which intersects the substrate at a point offset from the center axis, wherein the exit aperture is positioned at an orthogonal distance, a lateral distance, and a tilt angle relative to the center axis of the substrate; and a positioning mechanism that allows dynamic adjusting of the orthogonal distance, the lateral distance, or the tilt angle;

wherein the positioning mechanism comprises a bracket that is secured along a slot, a linear actuator, an arm that has an adjustable length, or a post that has an adjustable length.

14. The system of claim 13, wherein the positioning mechanism is coupled to the material source.

15. The system of claim 13, wherein the positioning mechanism is coupled to the rotation mechanism.

16. The system of claim 13, wherein the material source is a cosine N source and N≥2.

17. The system of claim 13, wherein the substrate has a diameter equal to or greater than 6 inches (150 mm).

18. The system of claim 13, wherein:

the material source is a nitrogen plasma source that emits active nitrogen; and the system further comprises an oxygen plasma source.

19. The system of claim 13, further comprising additional material sources including one or more sources of Mg, P, Al, Zn or Ga.

* * * * *